(12) United States Patent
Yee et al.

(10) Patent No.: US 7,846,774 B2
(45) Date of Patent: Dec. 7, 2010

(54) MULTIPLE ROW EXPOSED LEADS FOR MLP HIGH DENSITY PACKAGES

(75) Inventors: Mow Lum Yee, Perak (MY); Chee Heng Wong, Perak (MY); Shang Yan Choong, Perak (MY); Kam Chuan Lau, Perak (MY); Kok Siang Goh, Perak (MY); Voon Joon Liew, Perak (MY); Chee Sang Yip, Perak (MY); Say Yeow Lee, Perak (MY)

(73) Assignee: Carsem (M) SDN. BHD., Perak Darul Ridzuan (MY)

( * ) Notice: Subject to any disclaimer, the term of this patent is extended or adjusted under 35 U.S.C. 154(b) by 1146 days.

(21) Appl. No.: 11/465,757

(22) Filed: Aug. 18, 2006

(65) Prior Publication Data

US 2007/0281392 A1   Dec. 6, 2007

(30) Foreign Application Priority Data

Jun. 5, 2006   (MY) .............................. PI 2006 2594

(51) Int. Cl.
H01L 21/50 (2006.01)
H01L 21/48 (2006.01)
H01L 21/44 (2006.01)

(52) U.S. Cl. ...................... 438/111; 438/112; 438/123; 438/124; 438/127

(58) Field of Classification Search ................... None
See application file for complete search history.

(56) References Cited

U.S. PATENT DOCUMENTS

| 6,448,633 | B1 * | 9/2002 | Yee et al. ..................... 257/666 |
| 6,797,540 | B1 * | 9/2004 | Li et al. ...................... 438/111 |
| 6,876,068 | B1 * | 4/2005 | Lee et al. ..................... 257/676 |
| 7,015,072 | B2 * | 3/2006 | Combs et al. ................ 438/122 |
| 7,075,816 | B2 * | 7/2006 | Fee et al. ..................... 365/158 |

OTHER PUBLICATIONS

"Data sheet—*Micro* LeadFrame QFN Package®", product description, publication of Amkor Technology, Jul. 2005, pp. 1-2.
"QFN—Quad Flat No-Lead Package", product description, publication of STATS ChipPAC Ltd., May 2006, pp. 1-2.

* cited by examiner

*Primary Examiner*—Zandra Smith
*Assistant Examiner*—Khanh B Duong
(74) *Attorney, Agent, or Firm*—Townsend and Townsend and Crew LLP

(57) ABSTRACT

A leadframe strip production process provides encapsulated semiconductor chips with more than two annular rows of exposed leads by utilizing two types of frames, a leadframe to which IC devices are mounted, and a ring frame strip that is attached to the leadframe with a non-conductive adhesive. The leadframe includes die pads that receive the IC chip devices, and each die pad is positioned within multiple rows of connecting pads for connection with bonding pads of the device to be encapsulated. The connecting pads of the leadframe are arranged in an annular fashion, with inner rows being closer to the die pad and outer rows being farther from the die pad.

19 Claims, 25 Drawing Sheets

MULTIPLE ROW EXPOSED LEADS FOR MLP HIGH DENSITY PACKAGES

BACKGROUND

1. Field of the Invention

The present invention relates generally to integrated circuit packaging and, more particularly, high density micro lead frame packages.

2. Related Art

Recently developed packages for integrated circuit (IC) die or chips include the quad flat, no-lead (QFN) package and the dual flat, no-lead (DFN) package. The DFN package is essentially the same as a QFN package except the DFN package includes leads on two sides of the package instead of four. The no-lead construction provides an IC package having an encapsulation body with leads for electrical connection that do not protrude or extend from the body. That is, the package has leads that are flush with the underside of the encapsulation body and do not extend outwardly, thereby permitting the package to have a compact size. The QFN and DFN packages can be surface-mounted on a printed circuit board (PCB) and can be electrically connected to the PCB at the non-protruding leads on the underside of the encapsulation body.

Leadframe production techniques make use of a leadframe strip having hundreds of die pads, onto which semiconductor chips (also referred to as dies or devices) are mounted and then encapsulated. Packages such as the QFN and the DFN are sometimes referred to within the semiconductor industry as micro lead frame packages (MLF or MLP). The semiconductor devices are typically mounted onto die pads of the leadframe strip using epoxy or other adhesives. The leadframe strip includes finger-like connecting tabs (also called leads or contact pads) that extend from the frame strip around each of the die pads. A single leadframe strip can include hundreds of die pads and corresponding numbers of leads for each die pad. Each device is then electrically connected to the leadframe by wire bonds that extend from the leads of the leadframe to bonding pads of each device. The leadframe with bonded devices and wire bond connections is then laid flat and encapsulated in plastic or resin, protecting the device and wire connections from environmental effects and leaving the exposed leads on the underside of the leadframe. The encapsulated devices are then segmented from the leadframe, either by saw cutting or stamping, thereby producing the MLPs in large quantity. The leadframe production technique can provide encapsulated chips at lower cost and with smaller physical sizes as compared with non-leadframe production techniques. The leadframe production techniques, however, cannot generally provide exposed contacts on packages in an array configuration, thus limiting the number of exposed leads that can be provided.

FIG. 1 is a cross-sectional view of a simplified MLP 100. The MLP 100 includes an IC die 102 attached to a die pad portion 104 of a leadframe 106 by an adhesive 108. Bonding pads 110 are formed on the top of the IC die 102 and are connected to leads 112 of the leadframe 106 by wirebonds 114. An encapsulant material 120 covers the package including the IC die 102, the wirebonds 114, and the upper surfaces of the die pad 104 and leads 112. The die pad 104 and leads 112 are exposed on the bottom of the package 100, thereby facilitating heat dissipation from the IC die 102 external to the package and decreasing the overall thickness of the package. A half-etched portion 122 can be formed on the sidewall surface of the die pad 104 and leads 112 to better mechanically secure the die pad and leads to the encapsulant material, which flows underneath the half-etched portion 122.

Typically, many MLP 100 IC packages are formed in a matrix pattern on a leadframe strip, and the MLP is typically encapsulated using one of two different techniques, which can be referred to as block molding or matrix molding. Packages encapsulated using a block molding technique are typically separated from the lead frame strip using a sawing process while packages encapsulated using a matrix molding technique are typically separated from the lead frame using a punch process. To accommodate the different types of encapsulation and singulation processes, leadframe strips are specifically designed for one or the other technique. Thus, "leadframe" refers to production techniques associated with IC packages mounted on die pad attachment strips, and "no-lead" or "leadless" packages refers to a produced IC package in which the encapsulation body has connecting leads that are flush with the body and thus appear to be without leads.

FIG. 2 is a view of the underside of the FIG. 1 MLP 100. The leadframe portion 106 is visible in FIG. 2, and shows that the MLP includes a row of contacts 202 on each edge of the MLP encapsulation body that comprise the ends of the leads 112 first shown in FIG. 1. Thus, the MLP illustrated is a QFN package. Although each edge of the MLP 100 is shown with three contact leads per edge, it should be understood that a greater number of contact leads are typically included on each edge. For example, MLP configurations typically include configurations with sixteen leads in total, with four leads per body edge for a QFN.

Current chip design trends are to provide an increasing number of exposed leads per chip package. At the same time, trends are for decreasing the overall size of the encapsulation package. Thus, a greater number of exposed leads in a smaller package has resulted in much greater density of exposed leads. Increasing the number of rows of exposed leads per edge would help accommodate greater lead density of the packages. For leadframe production techniques, it is possible to provide two rows of contacts per package edge. That is, each edge includes an outer row of contacts along the outside edge of the chip package and also includes an inner row of contacts adjacent the outer row, typically offset from the outer row in a staggered configuration. For example, an encapsulated chip package with two rows of contacts along an edge is described in U.S. Pat. No. 6,229,200 and another encapsulated chip package with two rows per package edge is described in U.S. Pat. No. 6,838,751.

MLPs with two rows of exposed leads per package edge can be produced by constructing the leadframe with staggered leads connected to the leadframe by half-etch portions, such that the leads include an outer row of contacts and an adjacent, parallel but staggered row of inner contacts. The outer row of contacts are located around the periphery of a leadframe member, extending from the leadframe strip, and the inner row of contacts are located around the periphery of the die pad of the leadframe member. An IC device is placed in the center of each leadframe die pad structure and is then wire-bonded to the leads (contact tabs) of the leadframe in alternating fashion, one contact having a wire bond to an outer contact pad, the next contact having a wire bond to an adjacent inner contact pad, and so forth. Segmentation of the bonded chips from the frame, isolating the contact pads from the leadframe, is followed by encapsulation and other post-encapsulant processing to produce the finished two-row packages.

The two-row leadframe construction increases the number of available contacts for each chip package. The two rows of connecting tabs can be provided in the leadframe by half-etched fingers that extend from the frame to the inner row from one direction and extend from the frame to the outer row from another direction. For the leadframe construction, at the start, the connecting tabs must be physically connected to each other and the frame. During production, the half-etched fingers are removed, thereby physically and electrically isolating the connecting tabs from each other, and providing two rows of exposed leads. Unfortunately, two rows of exposed leads are the practical limit of current leadframe production technology, given the need for physically connecting the contact tabs to the leadframe during the production process. Nevertheless, the trend for increasing the number of lead contacts on a chip package creates a need techniques that accommodate two or more numbers of rows of exposed leads per chip package, in combination with efficient and economical leadframe production techniques. The present invention satisfies this need.

SUMMARY

Embodiments of the invention provide MLP constructions having multiple rows of exposed leads. Two or more rows of exposed leads can be provided on each edge of the package. In accordance with the embodiments, a plurality of integrated circuit chips of a leadframe strip can be attached to the leadframe and encapsulated by coating a non-conductive adhesive material onto an attachment surface of a ring frame strip having at least one ring member, cutting the ring member from the ring frame strip, attaching the ring member to a multiple row leadframe at the attachment surface such that the adhesive material bonds the multiple row leadframe and ring member together, wherein the multiple row leadframe includes connecting pads arranged in at least two rows along a side of the leadframe and the connecting pads of two connecting pad rows are suspended by interconnects. The interconnects are removed from the multiple row leadframe, and then encapsulation operations are completed to encapsulate integrated circuit chips bonded to the multiple row leadframe. The interconnects of the leadframe serve to connect adjacent leads, or connecting pads, of the leadframe that will receive wire bonds from corresponding bonding pad contacts of the chip device being encapsulated. Removing the interconnects serves to physically and electrically isolate the connecting pads from each other. Prior to removal, the interconnects of the ring member hold the connecting pads in place. In this way, completed MLP products can be provided with multiple rows of exposed leads, including three rows and greater. This construction provides greater numbers of rows of exposed leads per chip package than are currently available with leadframe production techniques.

In another embodiment, the connecting pads of the multiple row leads leadframe are arranged in a staggered fashion, so that connecting pads in one row are offset from pads in an adjacent row. The connecting pads can be arranged in an annular construction, so that an innermost row of connecting pads generally surrounds the die pad, and outer rows generally encircle the inner pads. In another embodiment, the leadframe interconnects between the connecting pads are of reduced thickness as compared with other portions of the leadframe. The interconnects can comprise, for example, half-etch fingers that extend from a connecting pad in one row to adjacent connecting pads in the same row. The ring frame strip can be attached to the leadframe by a non-conductive adhesive, such as a non-conductive epoxy. The ring frame strip can be constructed of conductive or non-conductive material. Tie bars serve to suspend an individual ring member from the ring frame strip, prior to being cut from the ring frame strip.

Other features and advantages of the present invention should be apparent from the following description of the preferred embodiments, which illustrate, by way of example, the principles of the invention.

DETAILED DESCRIPTION

Embodiments of the invention provide techniques to produce multiple-row MLPs in which a plurality of integrated circuit (IC) chips are attached to a leadframe strip and are encapsulated. As described herein, multiple-row MLPs are produced utilizing two types of frames, a leadframe to which IC devices are mounted, and a ring frame strip that is attached to the leadframe with a non-conductive adhesive. The leadframe includes die pads that receive the IC chip devices, and each die pad is positioned within multiple rows of connecting pads for connection with bonding pads of the device to be encapsulated. The connecting pads of the leadframe are arranged in an annular fashion, with inner rows being closer to the die pad and outer rows being farther from the die pad.

Figure 3:
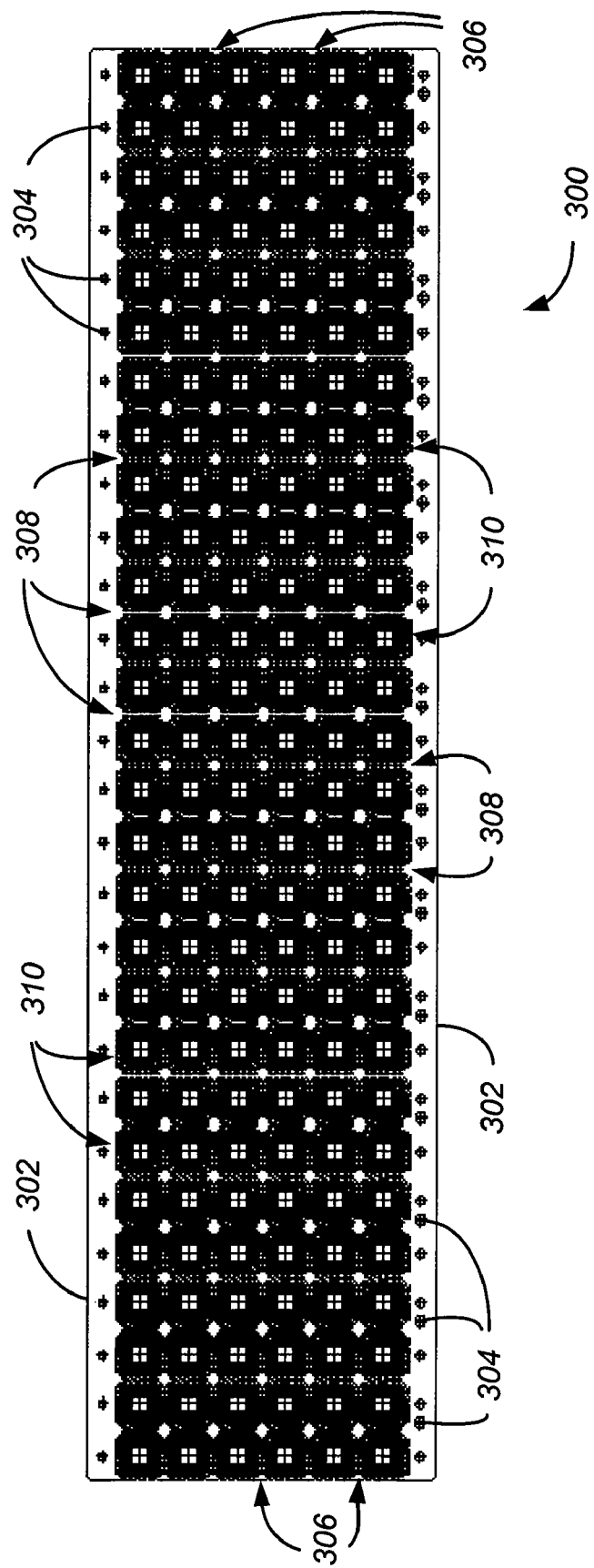
FIG. 3 is a plan view of a multiple rows leadframe constructed in accordance with the invention.

FIG. 3 is a plan view of an exemplary multiple rows leadframe 300 constructed in accordance with the invention and oriented length-wise. The leadframe 300 includes an outer frame 302 with locating holes 304 for proper positioning of the leadframe during production. The leadframe also includes a plurality of horizontal and vertical connecting bars 306, 308 respectively, which form a plurality of inner frame members 310. An individual inner frame member includes a single die pad for receiving a semiconductor device, and is described in greater detail below.

Figure 4:
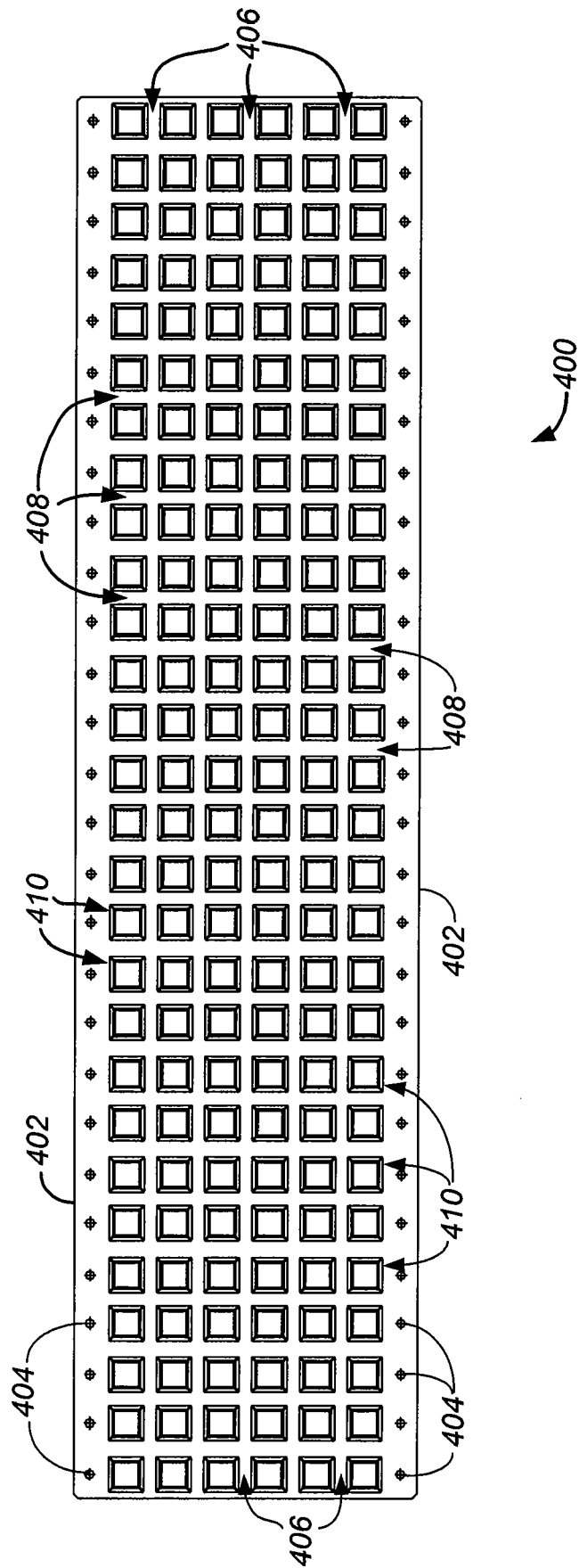
FIG. 4 is a plan view of a ring frame strip constructed in accordance with the invention to mate with the multiple rows leadframe shown in FIG. 3.

FIG. 4 is a plan view of an exemplary ring frame strip 400 constructed in accordance with the invention to mate with the multiple rows leadframe 300 shown in FIG. 3. The ring frame strip is shown in FIG. 4 oriented length-wise. The ring frame strip includes an outer frame 402 with locating holes 404 for proper positioning of the ring frame strip during production. The ring frame strip also includes a plurality of horizontal and vertical connecting bars 406, 408 respectively, which form a plurality of inner frames 410. Each inner frame of the strip comprises a ring member. Because the ring frame strip 400 of FIG. 4 is configured to mate with the leadframe 300 of FIG. 3, the arrangement of inner frame ring members 410 matches the number and configuration of inner frames 310 of the leadframe for proper alignment. That is, there is a one-to-one correspondence between the number of leadframe members 310 and the ring frame strip members 410. An individual inner frame ring member of the ring frame strip is described in greater detail below. The leadframe strip 300 is pre-plated, while the ring frame strip 400 can be pre-plated or not plated. Examples of suitable plating compositions are nickel palladium, tin, and tin lead.

Figure 5:
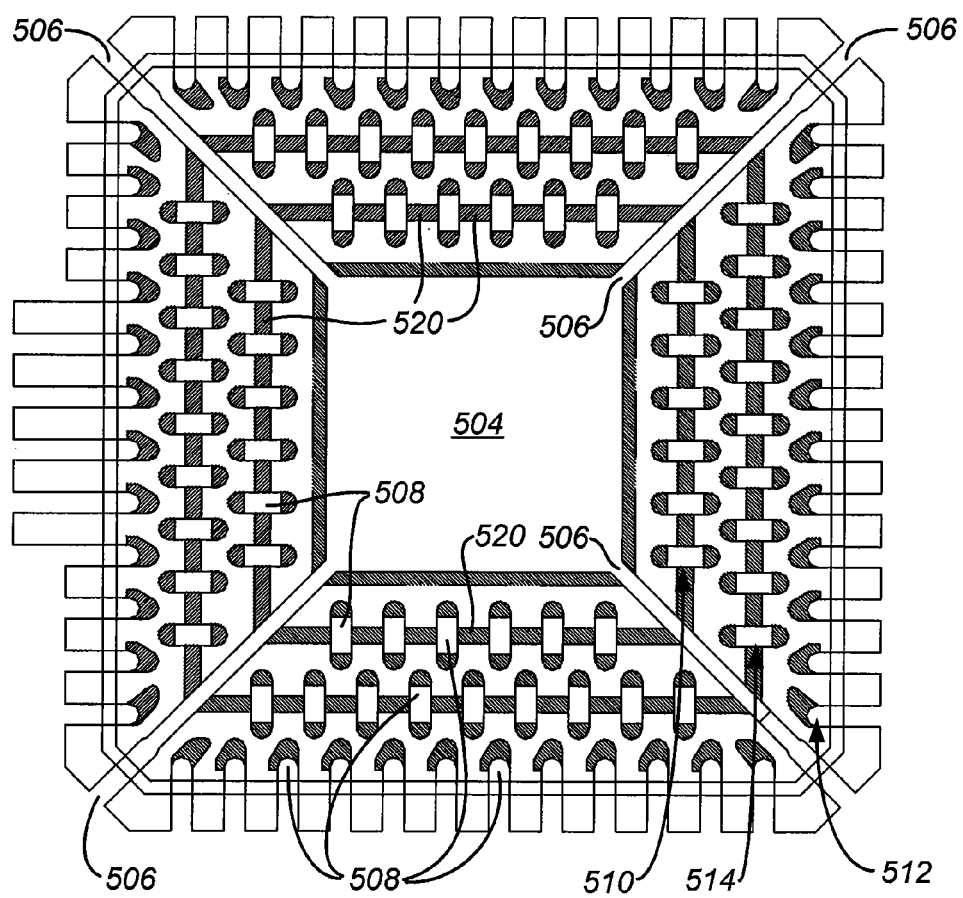
FIG. 5 is an illustration of a single three-row lead frame member of the multiple rows leadframe shown in FIG. 3.

FIG. 5 is an illustration of a single leadframe member 310 of the multiple rows leadframe 300 shown in FIG. 3. Each of the leadframe members of the leadframe 300 includes a die pad 504 that is suspended from the frame by tie bars 506, one at each corner of the die pad. The leadframe member also includes connecting pads (leads) 508. In the plan view of FIG. 5, the diagonal shading lines indicate areas of reduced thickness of the underside of the leadframe member 310. The reduced thickness areas can be provided, for example, using half-etched techniques know to those skilled in the art. FIG. 5 shows that the leadframe member 310 is a three-row configuration for a QFN package. Thus, each side of the leadframe member includes three rows of connecting pads, the rows comprising an inner row 510, an outer row 512, and a middle row 514 that is disposed between the inner and outer rows. In the exemplary embodiment, the inner row 510 includes six connecting pads 508, the middle row 514 includes nine connecting pads 508, and the outer row 512 includes twelve connecting tabs. Thus, each side of the leadframe member 310 includes twenty-seven tabs. Each of the four sides of the FIG. 5 leadframe member has a similar construction, so that the finished QFN package will provide one-hundred-eight leads. A different number of connecting pads can be provided for each side of the leadframe member, depending on the tab width, spacing, and overall dimensions for the finished package.

FIG. 5 shows that the connecting pads of the innermost row 510 are connected to each other by interconnects 520, and the connecting pads of the next outwardly row 514 are also connected to each other by interconnects 520. At the ends of each row, the last interconnect pad is connected at one side to the adjacent tie bar 506. The interconnects 520 of the leadframe serve to connect adjacent connecting pads of the leadframe for a wire bond process. As known to those skilled in the art, the wire bond process electrically connects the connecting pads of the leadframe with corresponding bonding pad contacts of the chip device being encapsulated. The wire bonds can be attached in a conventional operation of the production process for producing the encapsulated chip package.

As noted above, conventional two-row MLPs are typically produced using a leadframe that has an outer row of connecting pads that are initially attached to the periphery of a leadframe member by connecting fingers that extend from the leadframe, and an inner row of connecting pads that are initially attached around the periphery of the die pad by connecting fingers extending from the die pad. During production, the connecting fingers are removed in a lead isolation operation, thereby isolating the connecting pads from each other and providing leads for the encapsulated device. That is, two rows of connecting pads in an annular arrangement can be provided because the outer row is initially supported by connection from the leadframe, and the inner row is initially supported by connection from the die pad, so that removing the support fingers during isolation operations will isolate the connecting pads from each other.

FIG. 5 shows that the novel multiple-row MLP of the illustrated embodiment includes an outer row 512 of connecting pads that are initially supported by connection from the leadframe itself, and at least two additional rows 510, 514 of connecting pads that are initially supported by reduced thickness interconnects that extend from each connecting pad to an adjacent connecting pad in the same row and, at the ends of each row, extend from an end connecting pad to an adjacent tie bar. For example, in FIG. 5, the outer row 512 can be supported by finger-like extensions from the connecting bars 306, 308 (see FIG. 3), and the rows of connecting pads 510, 514 other than the outer row 512 can be supported prior to isolation from the leadframe by the interconnects 520. Removing the interconnects 520 during production serves to physically and electrically isolate the connecting pads 508 from each other. Prior to removal, the interconnects of the ring member hold the connecting pads in place.

In the FIG. 5 embodiment, the die pad 504 has a thickness of approximately 0.2 mm, and each of tie bars 506 and leads 508 is 0.2 mm wide and 0.2 mm thick. Adjacent leads 508 of the leadframe are spaced apart with a spacing of 0.5 mm and are shown in a staggered configuration. Those skilled in the art will appreciate that these dimensions and spacings can vary, depending on the desired configuration. Parallel or aligned configurations also may be used. In addition, the interconnects 520 can be provided with the same thickness as the leadframe, or can be provided with reduced thickness. A reduced thickness interconnect can be easier to remove than a full-thickness interconnect, and can be provided in accordance with half-etch techniques and the like, which will be known to those skilled in the art.

Figure 6:
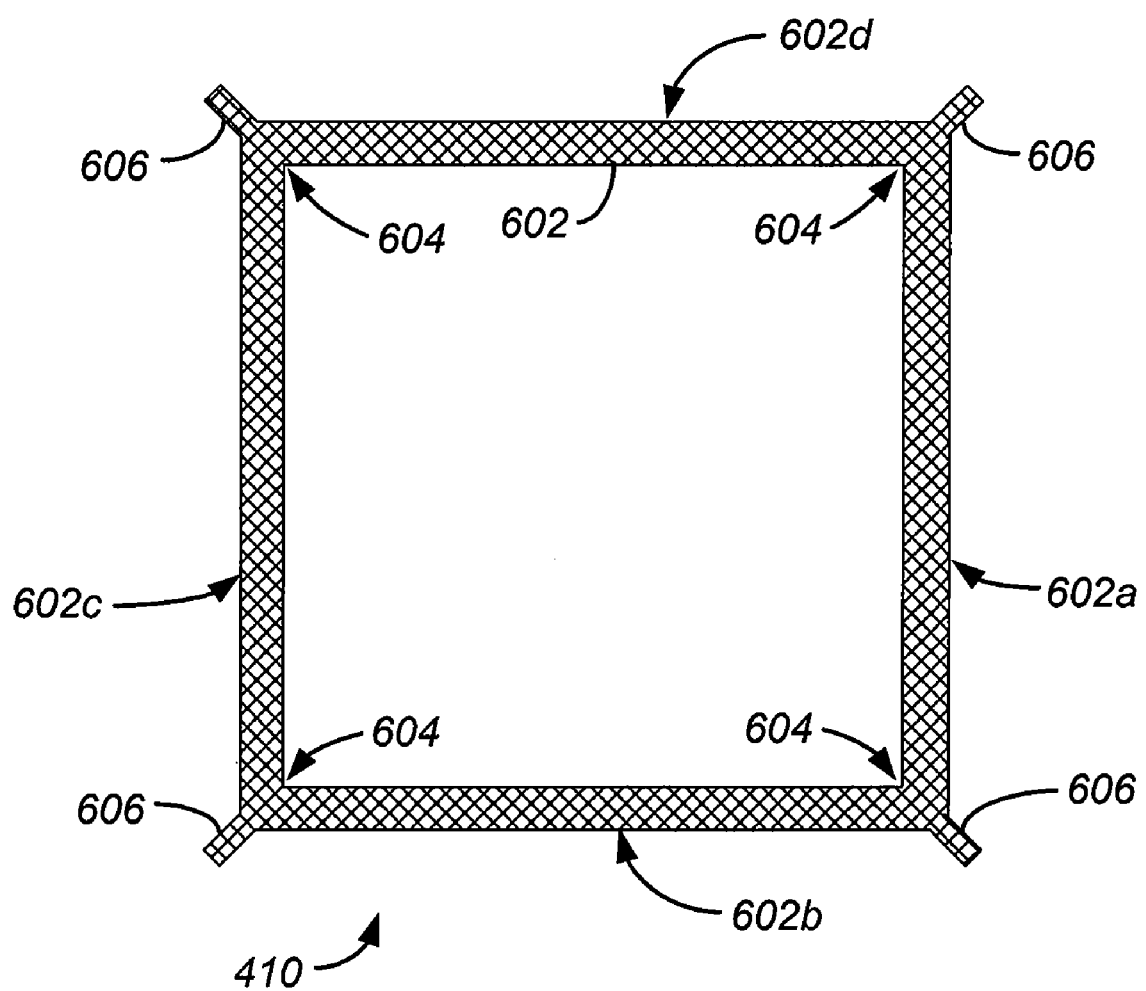
FIG. 6 is an illustration of a single ring member of the ring frame strip shown in FIG. 4.

FIG. 6 is an illustration of a single ring member 410 of the ring frame strip shown in FIG. 4. The exemplary ring member is a generally closed parallelogram ring structure having four sides 602 joined at four corners 604, at the outer ends of which is a short tie bar extension 606. The four sides of the ring structure are individually identified as 602a, 602b, 602c, and 602d. The tie bar extension is a portion of the ring frame strip that remains after the ring member is removed, or cut apart, from the ring frame strip during the production process. The FIG. 6 ring member 410 has only one four-sided ring structure and joins only two rows of connecting pads. As described further below, ring members can include multiple ring structures, in accordance with the configuration of the underlying leadframe to which they will be attached.

Figure 7:
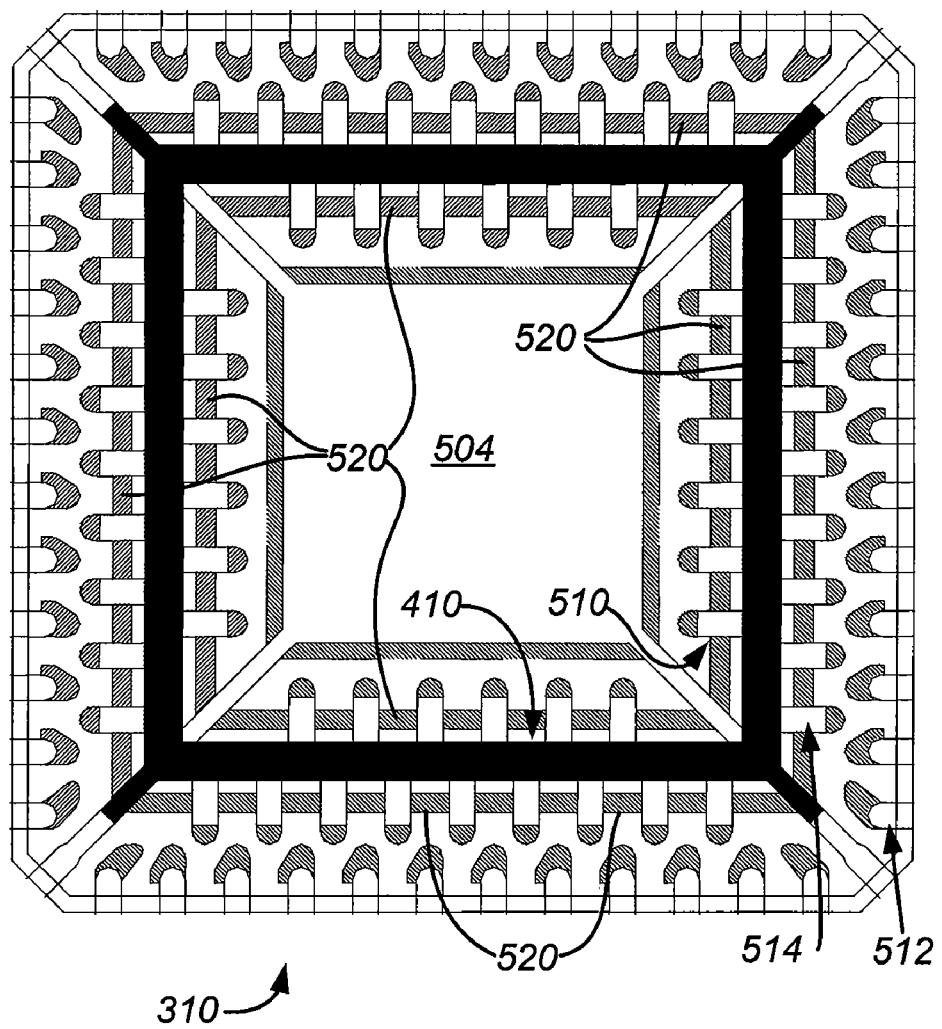
FIG. 7 is an illustration of the single leadframe member shown in FIG. 5 after a corresponding ring member from the FIG. 4 ring frame strip has been attached.

FIG. 7 is an illustration of the single leadframe member 310 such as shown in FIG. 5 after a corresponding ring member 410 such as shown in FIG. 6 has been attached and separated from the ring frame strip. In FIG. 7, the ring member 410 attached to the upper side of the leadframe is indicated as a solid black object. The ring member can be constructed of a metallic (conductive) material or can be constructed of a non-metallic material. The ring member 410 is attached to the upper side of the leadframe 310 with a non-conductive adhesive or an insulating material, such as non-conductive epoxy. The adhesive material can be applied, for example, as a coating that is deposited on the contact side of the ring member or in a screen printing process. As known to those skilled in the art, using an epoxy material requires a curing step before the production process can continue. FIG. 7 shows that the ring member 410 is a substantially closed structure that extends between two adjacent rows 510, 514 of the leadframe member 310 other than the outermost row 512, such that the ring member bridges the annular space between the two adjacent rows of inner connecting pads. FIG. 7 shows that, within a particular row of connecting pads, the pads are connected together by the interconnects 520. Constructions of the ring member other than FIG. 6 and FIG. 7 can be used, so long as the ring member supports leadframe connecting pads relative to the die pad during production and after isolation of the pads. For example, illustrations of additional ring member constructions are provided and are described below.

Figure 8:
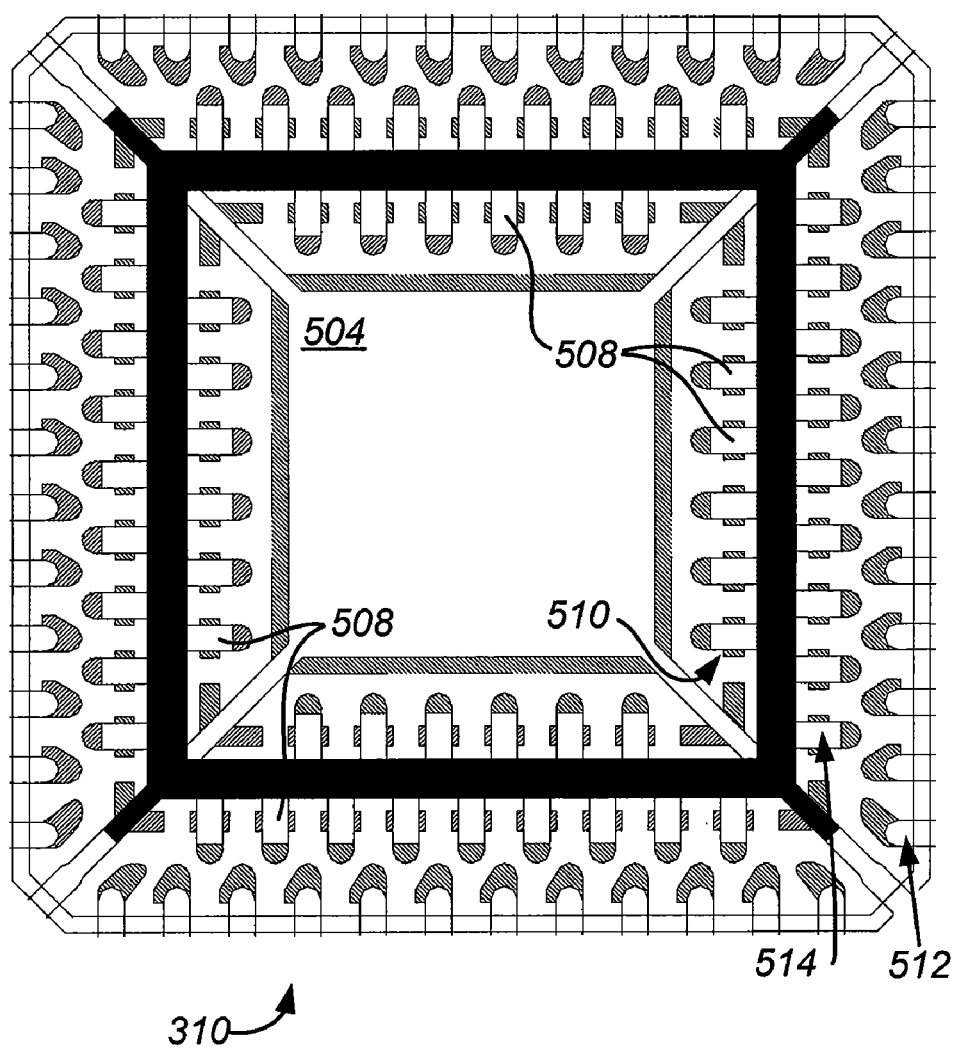
FIG. 8 is an illustration of the single leadframe member of FIG. 7 after the interconnects have been removed, thereby isolating the connecting pads.

FIG. 8 is an illustration of the single leadframe member 310 of FIG. 7 after the interconnects 520 between connecting pads 508 of the inner rows 510, 514 have been removed, thereby isolating the pads from each other. By comparing FIG. 5 with FIG. 8, it can be seen that the connecting pads of the inner rows 510, 514 are initially supported relative to the die pad 504 of the leadframe 310 by the interconnects 520 of the leadframe member, but after the isolation operation, the inner row connecting pads are supported by the ring member 410. FIG. 8 also shows that the ring member 410 is attached to the upper side of the leadframe member at the tie bars 506.

Figure 9:
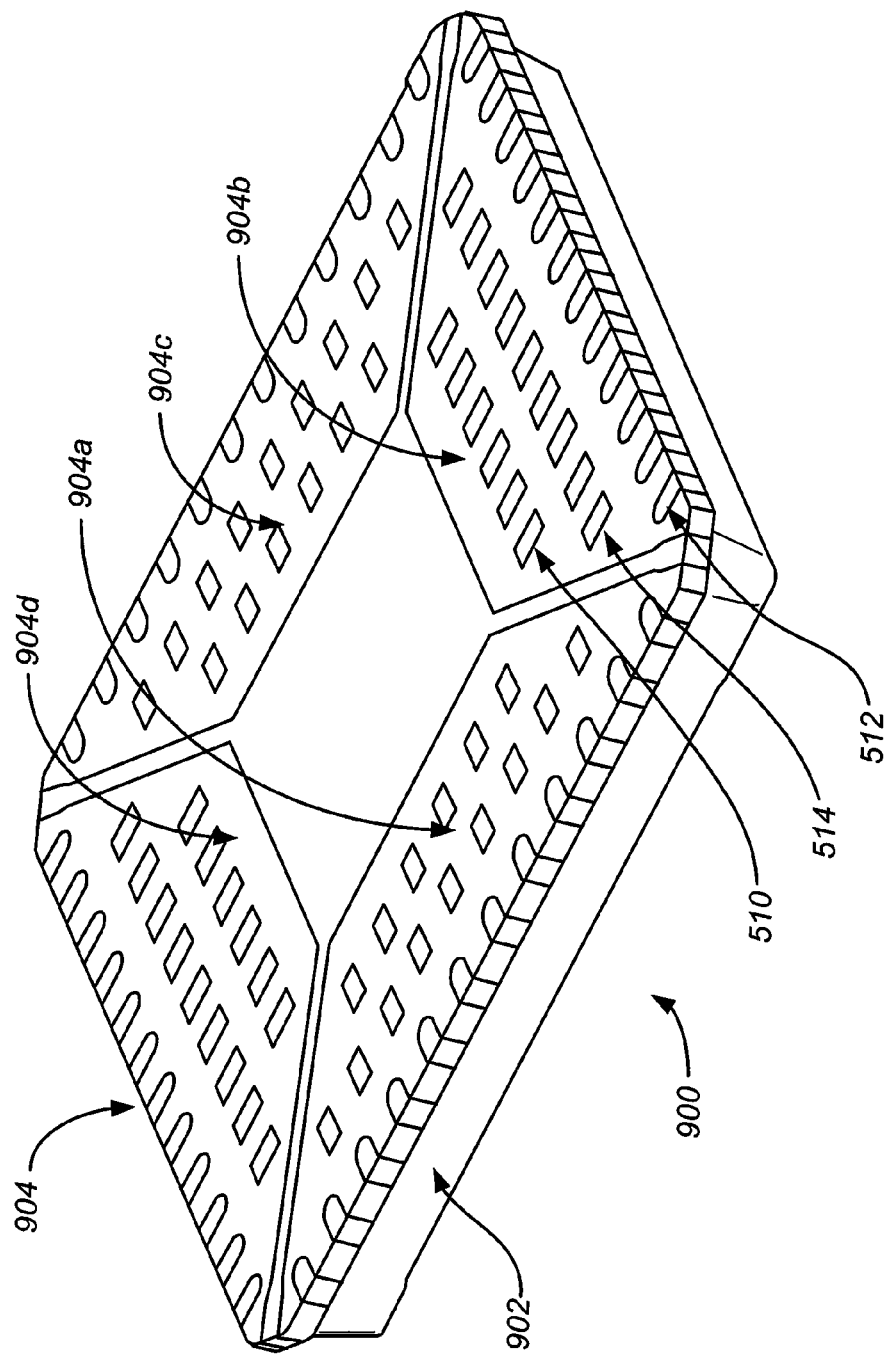
FIG. 9 is an illustration of the underside of the FIG. 8 construction after completion of production processing.

FIG. 9 is an illustration of a completed chip package 900 with the construction illustrated in FIG. 3 through FIG. 8. The package 900 of FIG. 9 includes an encapsulation body 902 in which the leadframe and ring member are enclosed. FIG. 9 shows the underside surface 904 of the package 900 and illustrates that, after processing is completed, the underside is arranged into four quadrants 904a, 904b, 904c, 904d of exposed leads, such that each of the four quadrants of the package underside 904 includes twenty-seven exposed leads. The bottom perspective view of FIG. 9 shows that the completed package 900 is a QFN package manufactured with leadframe production techniques and includes three rows of exposed leads 510, 514, 512 on each quadrant of, respectively, six, nine, and twelve leads each, arranged in an annular fashion on the underside of the package. Thus, the underside of the package shows a plurality of exposed leads, arranged into three annular rows comprising an innermost annular row arrangement of twenty-four exposed leads, a middle annular arrangement of thirty-six exposed leads, and an outermost annular arrangement of forty-eight exposed leads.

Figure 10:
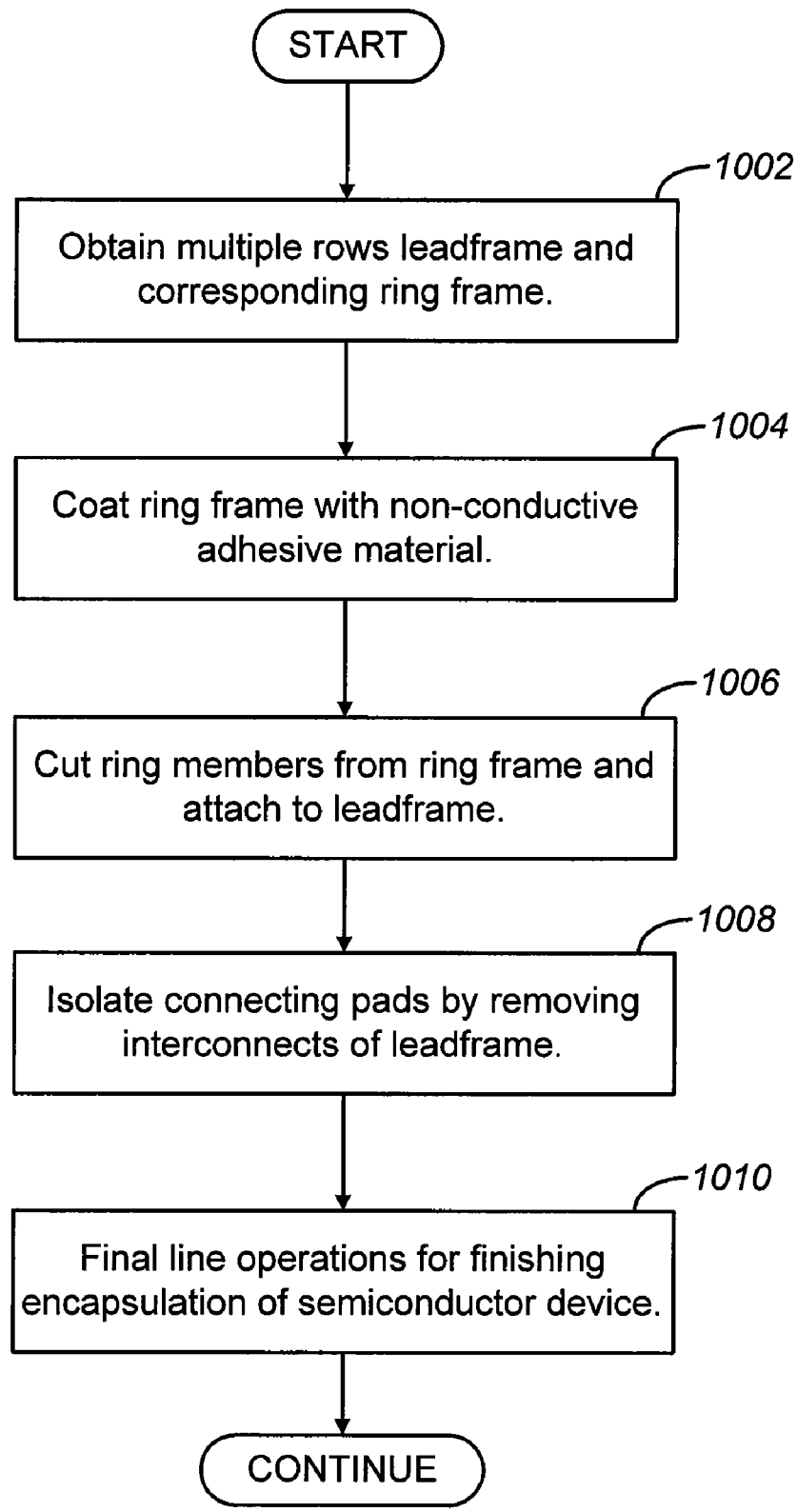
FIG. 10 is a flow diagram of the operations for producing the multiple rows MLP.

FIG. 10 is a flow diagram of the operations performed for producing the multiple rows MLP described herein. As a first operation, the leadframe and ring frame as described and shown in FIG. 3 and FIG. 4 herein are obtained. This initial operation is represented in FIG. 10 by the flow diagram box numbered 1002. In the first production step, illustrated by the box numbered 1004, a non-conductive adhesive material is coated onto an attachment surface of the ring frame strip. Next, at box 1006, the ring members are cut from the surrounding ring frame strip and are attached to the upper side of a multiple row leadframe at the attachment surface such that the adhesive material bonds the multiple row leadframe and ring member together. The ring members can be cut from the ring frame for attachment either singly, all at once, or any number in between (either one at a time, or two, or three, and so forth, as desired). The ring members can be attached to the leadframe strip at box 1006 either together, or simultaneously in any quantity, or singly one after another, as desired. At box 1008, the interconnects of the leadframe are removed, thereby isolating the connecting pads of the leadframe so they are supported relative to the die pad by the ring frame. The final operations for producing the MLP, represented by the box 1010, comprise conventional front-of-line and end-of-line processes. Those skilled in the art will understand the final operations 1010 that will be involved, to generally include die attachment, wirebonding, molding, and then singulation of the packages.

Figure 1:
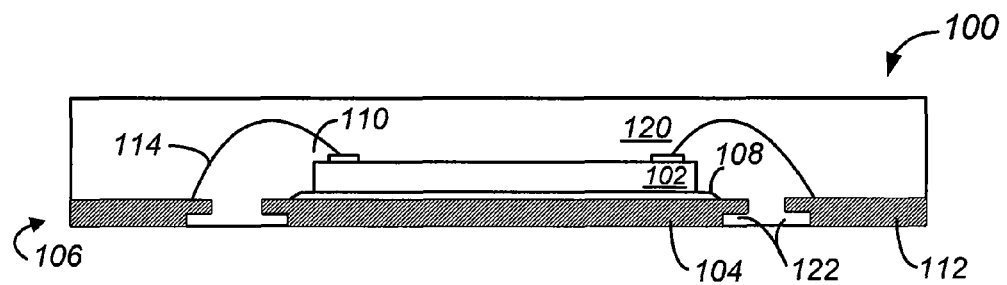
FIG. 1 is a simplified cross sectional view of an MLP package 100 that can be formed according to the techniques of the present invention.
Figure 2:
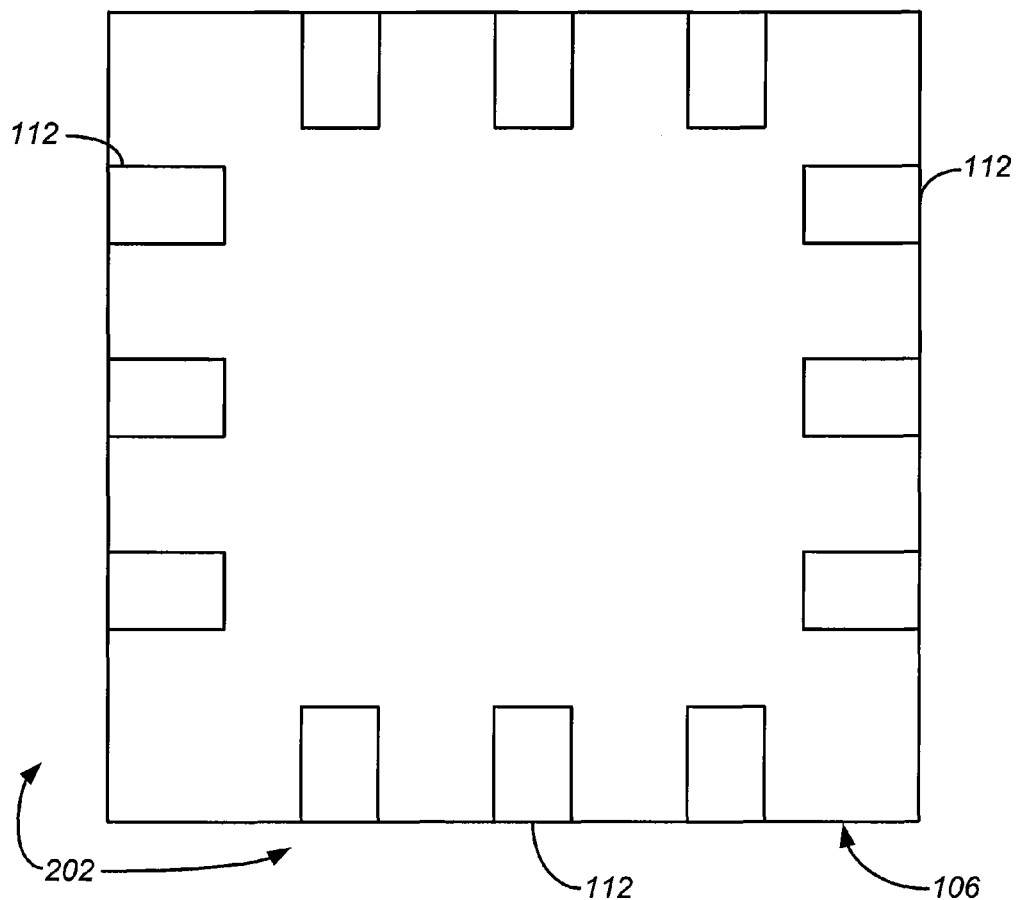
FIG. 2 is a bottom package view of the MLP 100 illustrated in FIG. 1.
Figure 11:
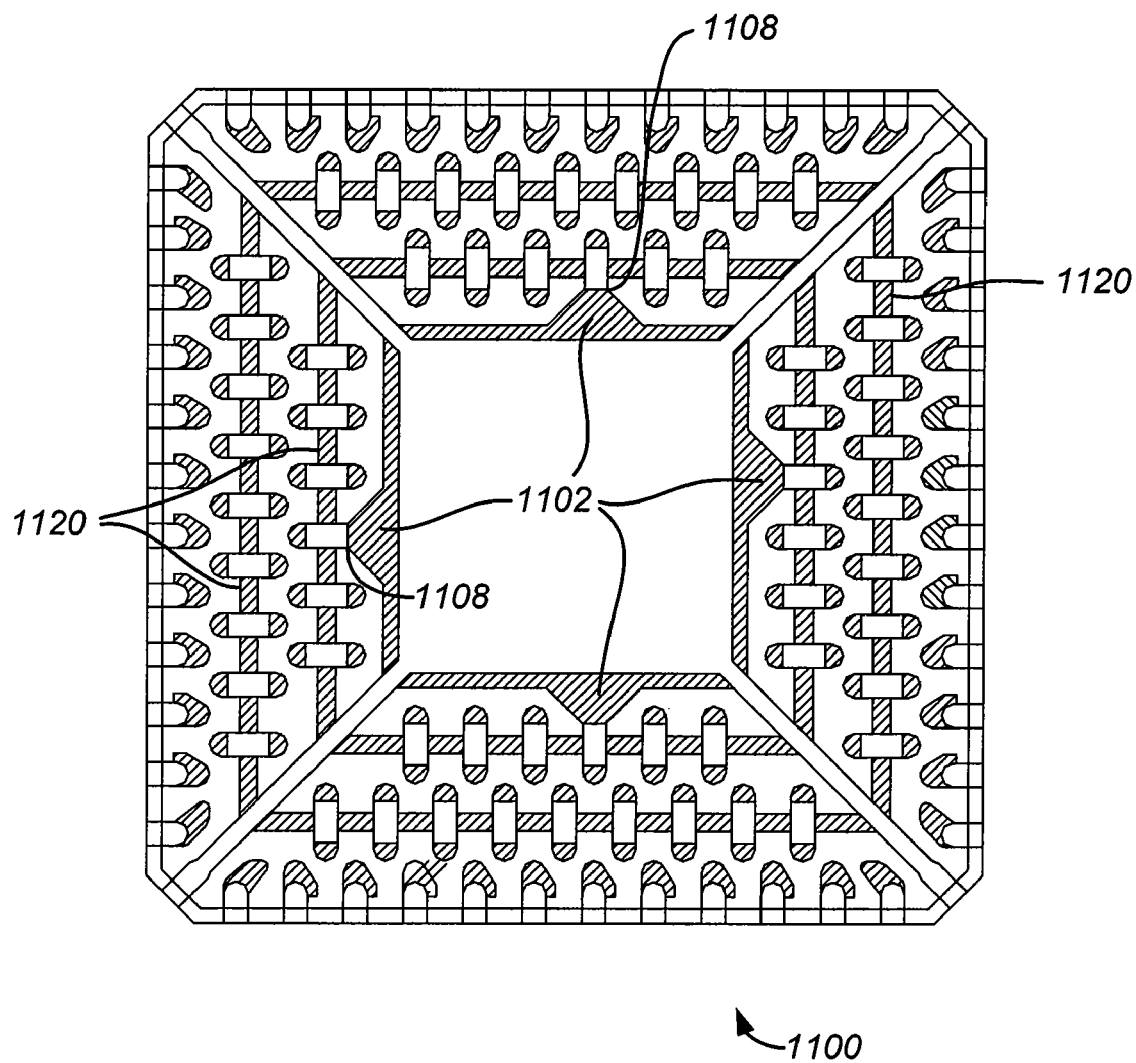
FIG. 11 is an illustration of an alternate embodiment of a three-row leadframe member that can be used in conjunction with the ring member illustrated in FIG. 6 above.

FIG. 11 is an illustration of an alternative embodiment of a leadframe member 1100 that can be used in conjunction with the ring member illustrated in FIG. 4 above. The leadframe member of FIG. 11 is similar to the leadframe member shown in FIG. 5, except that the FIG. 1 embodiment includes an inner leadframe portion with an enlarged area 1102 that provides a more robust ring support after the interconnects are removed. For example, the leadframe member 1100 can be used in conjunction with a ring member such as the ring member 410 illustrated in FIG. 6, in which case the enlarged areas 1102 provide support when the interconnects 1120 are removed, and the enlarged areas are fused or connected to a corresponding connecting pad lead 1108. In FIG. 11, only some of the structures are identified with reference numerals, for simplicity of illustration. It is to be understood that the same reference numerals description will apply to similar structures in the FIG. 11 drawing, and similarly with all the drawings in this document.

Figure 12:
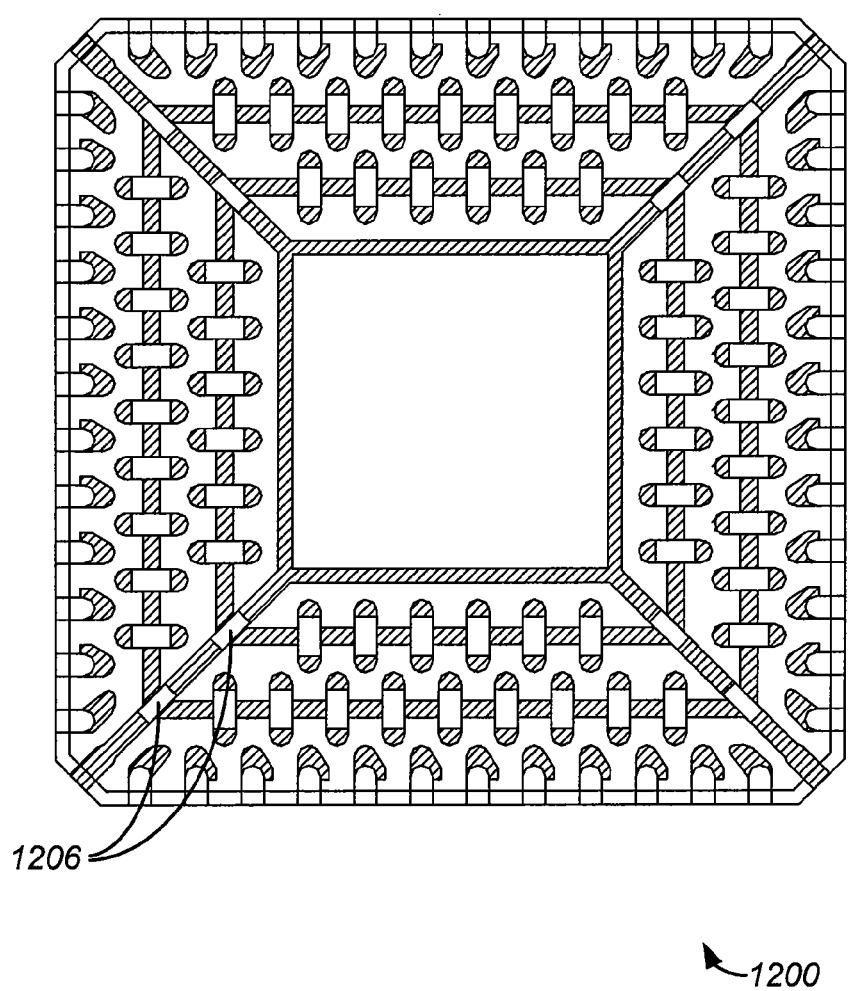
FIG. 12 is an illustration of an alternate embodiment of a three-row leadframe member that can be used in conjunction with the ring member illustrated in FIG. 6 above.

FIG. 12 is an illustration of an alternate embodiment of a three-row connecting pad leadframe member 1200 that can be used in conjunction with a ring member such as the ring member illustrated in FIG. 6 above. The leadframe member of FIG. 12 is similar to the leadframe member of FIG. 5, except that the FIG. 12 embodiment has a section of the tie bar 1206 that is half etched, whereas the tie bar 506 in FIG. 5 is solid.

Figure 13:
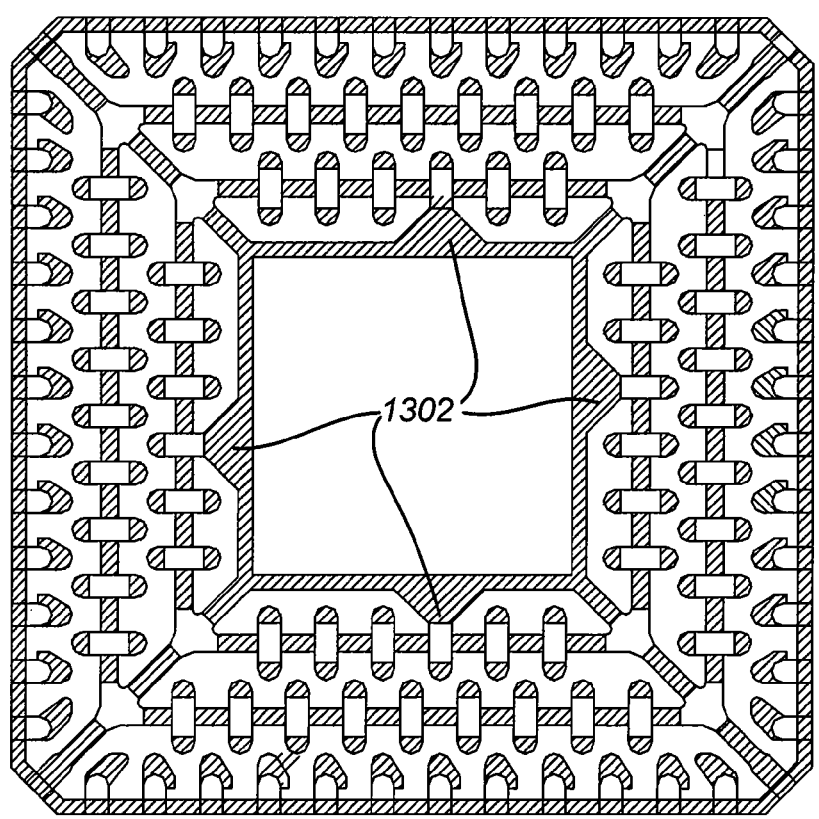
FIG. 13 is an illustration of an alternate embodiment of a three-row leadframe member that can be used in conjunction with the ring member illustrated in FIG. 6 above.

FIG. 13 is an illustration of an alternate embodiment of a three-row leadframe member 1300 that can be used in conjunction with a ring member such as the ring member illustrated in FIG. 6 above. The leadframe member FIG. 13 is similar to the leadframe member 1100 of FIG. 11, in that FIG. 13 also has an enlarged area 1302 that provides support when the interconnects are removed and is connected to a corresponding connecting pad lead.

Figure 14:
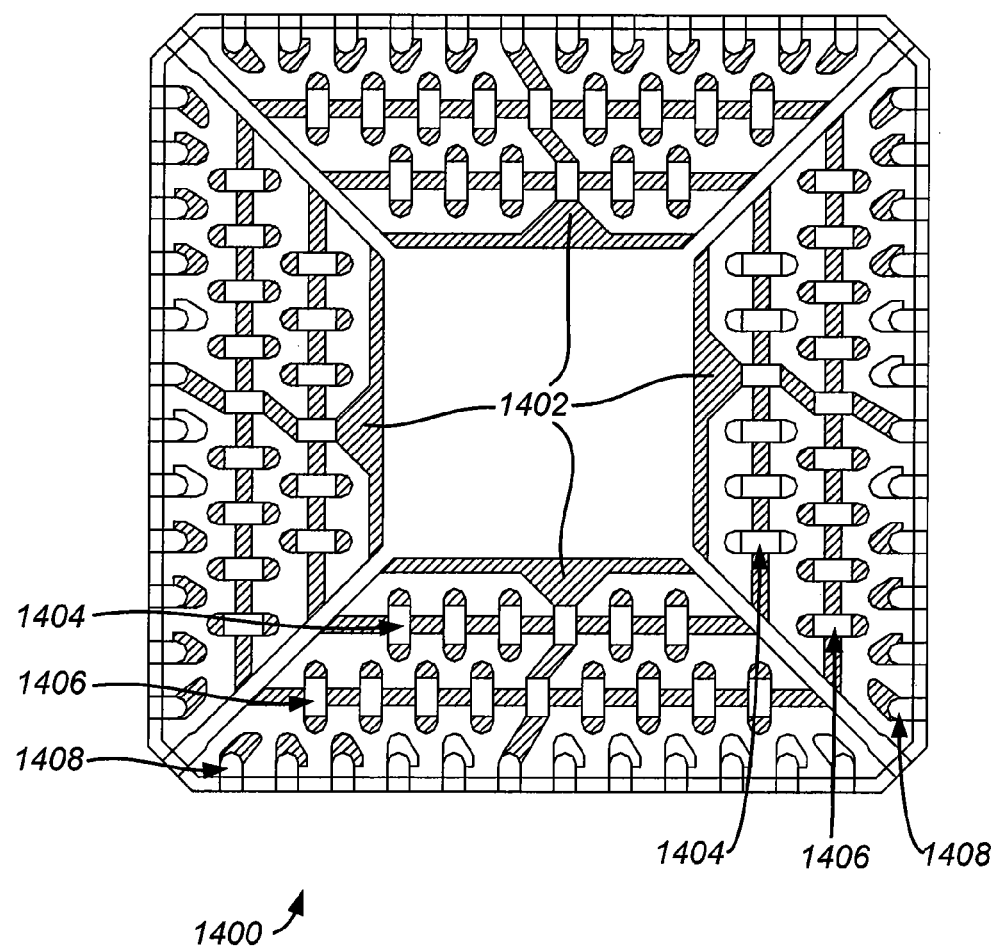
FIG. 14 is an illustration of an alternate embodiment of a three-row leadframe member that can be used in conjunction with the ring member illustrated in FIG. 6 above.

FIG. 14 is an illustration of an alternate embodiment of a three-row exposed leads leadframe member 1400 that can be used in conjunction with a ring member such as the ring member illustrated in FIG. 6 above. The leadframe member of FIG. 14 is similar to the leadframe member of FIG. 11 except that the enlarged area 1402 is fused or connected to one of the leads in the innermost row 1404, middle row 1406, and outer row 1408. The enlarged area provides a more robust ring support after the interconnects are removed.

Figure 15:
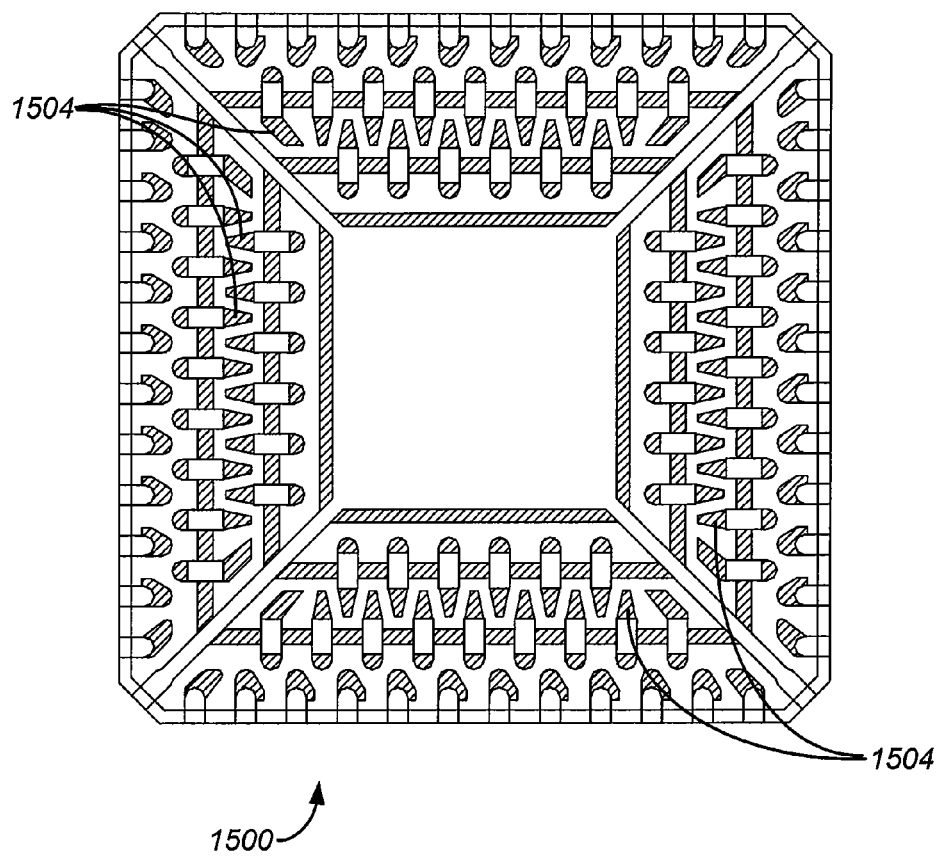
FIG. 15 is an illustration of an alternate embodiment of a three-row leadframe member that can be used in conjunction with the ring member illustrated in FIG. 6 above.

FIG. 15 is an illustration of an alternate embodiment of a three-row leadframe member 1500 that can be used in conjunction with a ring member such as the ring member illustrated in FIG. 6 above. The leaframe member of FIG. 15 is similar to that illustrated in FIG. 5, except that the half etched features on the leads of the FIG. 15 embodiment 1500 are elongated. The elongated leads 1504 of FIG. 15 are to provide increased contact surface to the ring member and to hold the lead more securely after the interconnects are removed.

Figure 16:
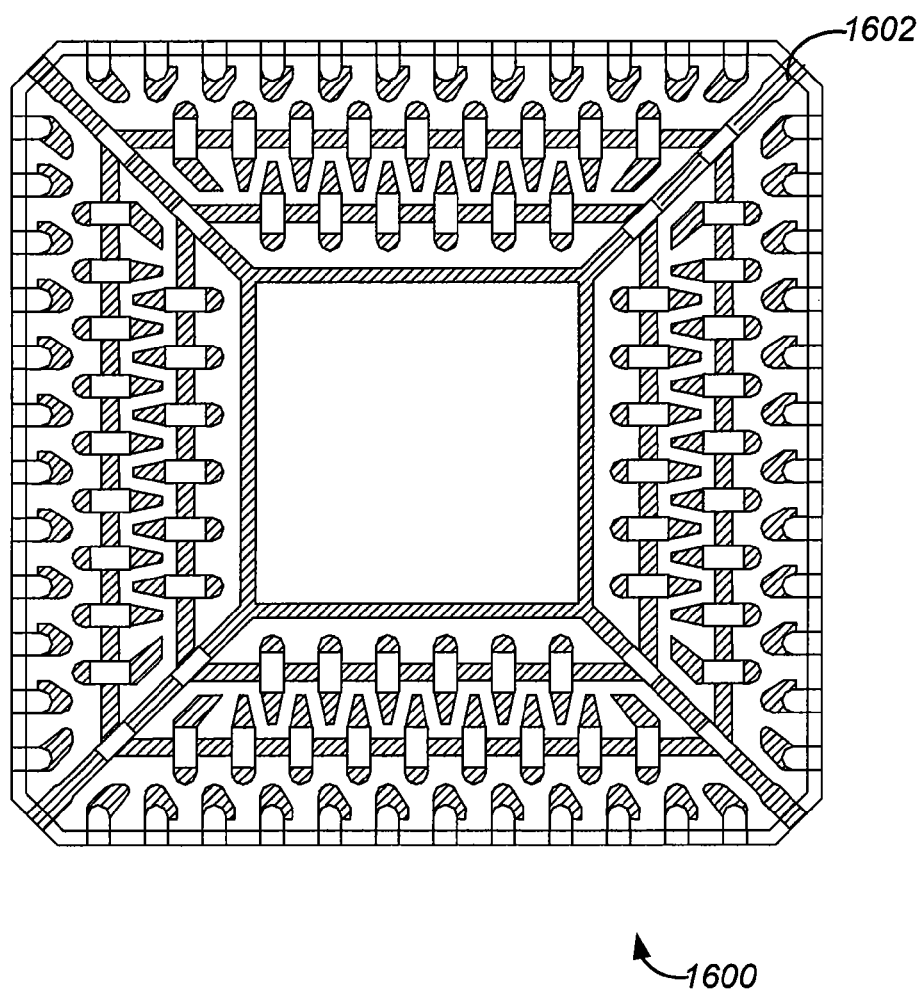
FIG. 16 is an illustration of an alternate embodiment of a three-row leadframe member that can be used in conjunction with the ring member illustrated in FIG. 6 above.

FIG. 16 is an illustration of an alternate embodiment of a three-row leadframe member 1600 that can be used in conjunction with a ring member such as the ring member illustrated in FIG. 6 above. The leadframe member of FIG. 16 is similar to that of FIG. 15, except that the FIG. 16 leadframe member 1600 has tie bars 1602 that are all half-etched.

Figure 17:
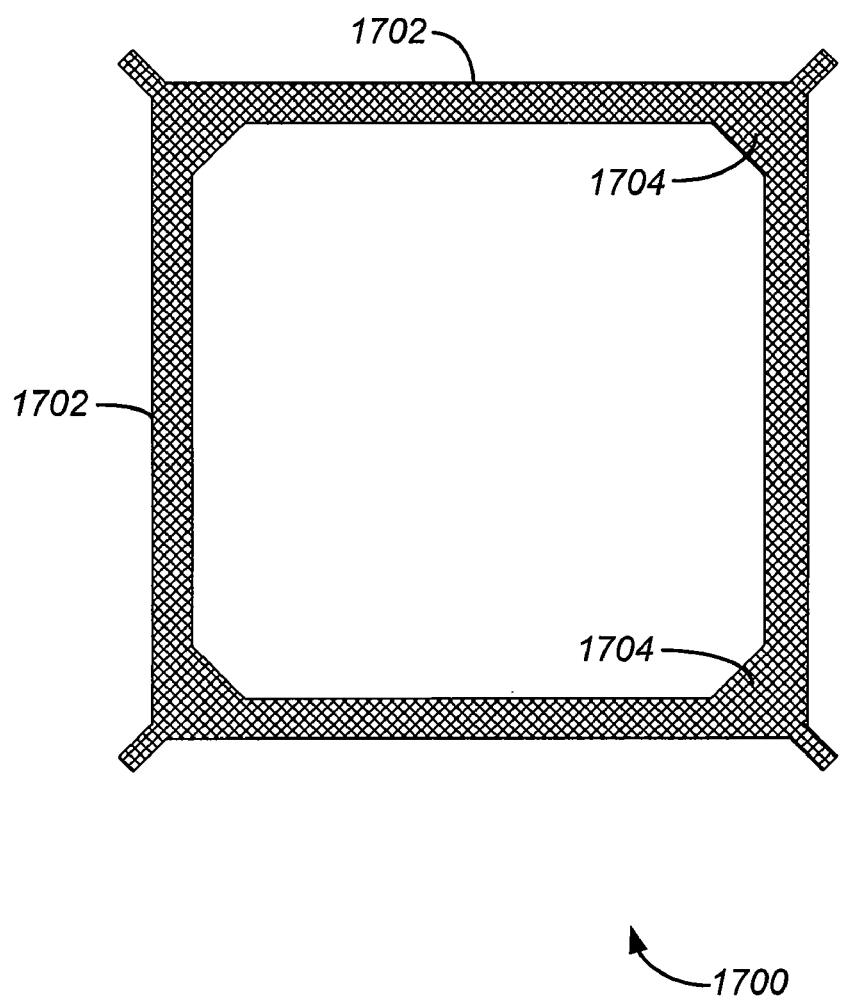
FIG. 17 is an illustration of an alternate embodiment of a full thickness ring member that can be used in conjunction with the three-row leadframe members illustrated in FIG. 5 and FIGS. 11-16 above.

FIG. 17 is an illustration of an alternate embodiment of a full thickness ring member 1700 that can be used in conjunction with the three-row leadframe members illustrated in FIG. 4 and FIGS. 11-16 above. The FIG. 17 ring member is a ring structure having four sides 1702 with enlarged tabs 1704 at each internal corner of the ring structure, that provide more surface area to contact at the tie bar area, thereby providing a more robust structure.

Figure 18:
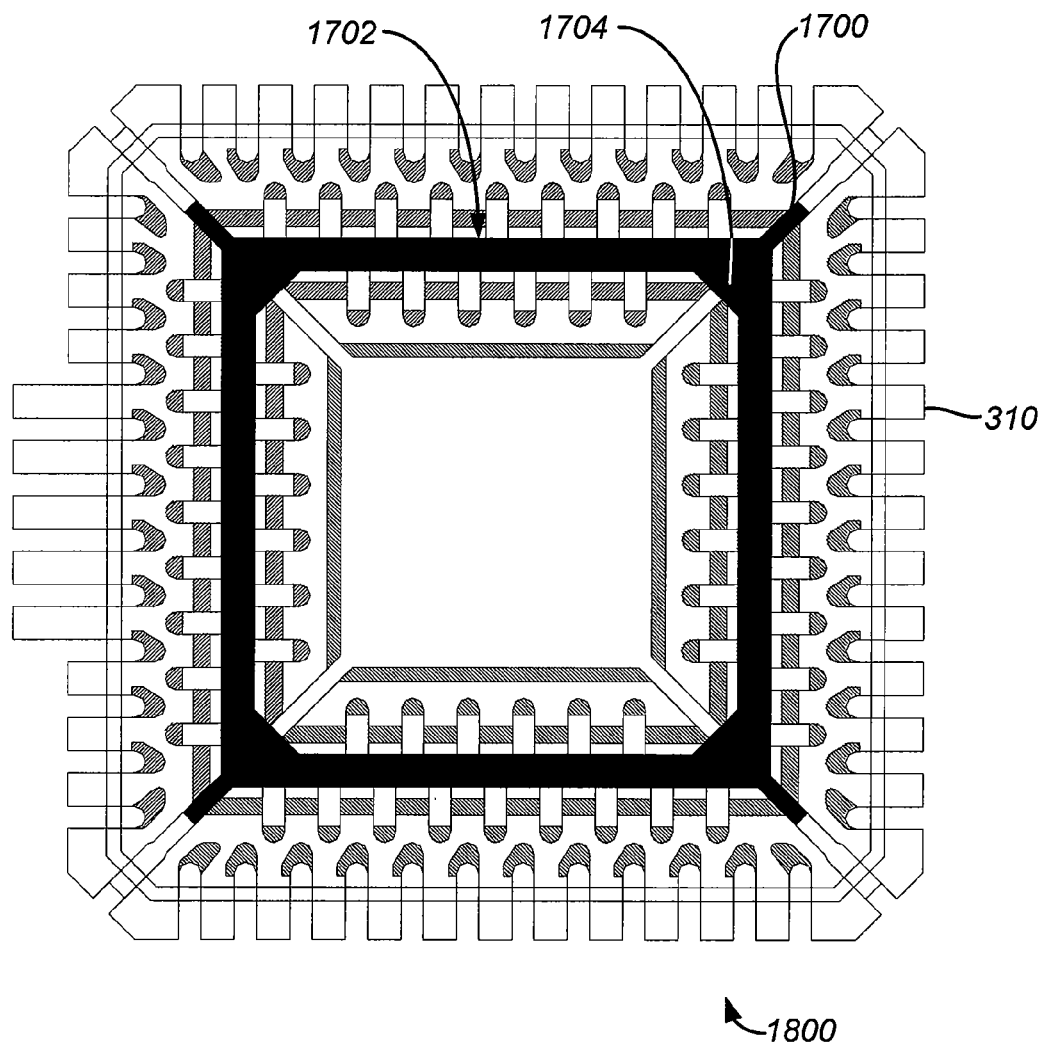
FIG. 18 is an illustration of the FIG. 17 ring member attached to a three-row leadframe member.

FIG. 18 is an illustration of a combination 1800 comprising the FIG. 17 ring member 1700 attached to a three-row leadframe member, such as the leadframe member 310 illustrated in FIG. 5. As was the case with the FIG. 7 illustration, the FIG. 18 illustration shows that the ring member 1700 aligns with the underlying leadframe member 310 to which it is attached, and makes contact to bridge two adjacent rows of connecting pads and thereby provide support for the connecting pads relative to the leadframe during production.

Figure 19:
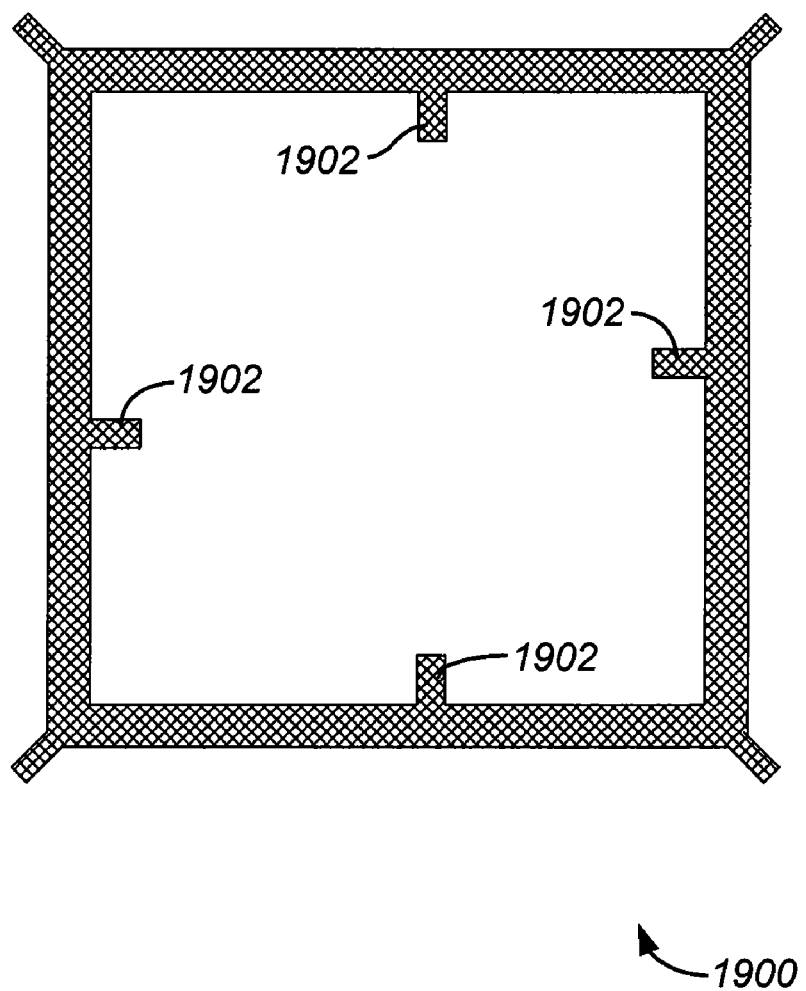
FIG. 19 is an illustration of an alternate embodiment of a ring member with inwardly directed tabs.

FIG. 19 is an illustration of an alternate embodiment of a ring member 1900 with inwardly directed tabs 1902. The FIG. 19 ring member is configured to mate with the three-row leadframe members illustrated in FIG. 11, FIG. 13, and FIG. 14, each of which includes an enlarged area 1102, 1302, 1402, respectively, that aligns with the inwardly directed tabs 1902.

Figure 20:
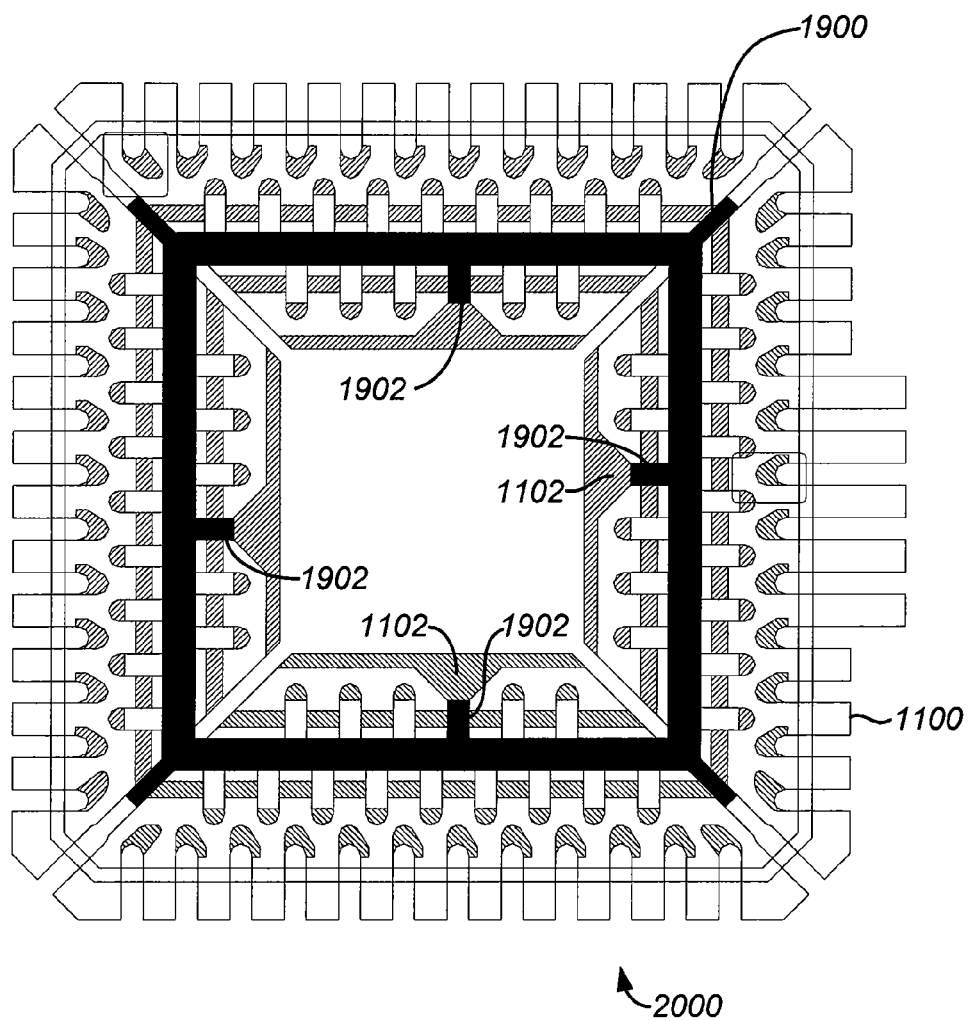
FIG. 20 is an illustration of the FIG. 19 ring member attached to the FIG. 11 three-row leadframe.

FIG. 20 is an illustration of a combination 2000 comprising the FIG. 19 ring member 1900 attached to the FIG. 11 three-row leadframe member 1100. The ring member tabs 1902 are configured to mate with (and be electrically connected to) the corresponding enlarged areas 1102 of the leadframe member.

Figure 21:
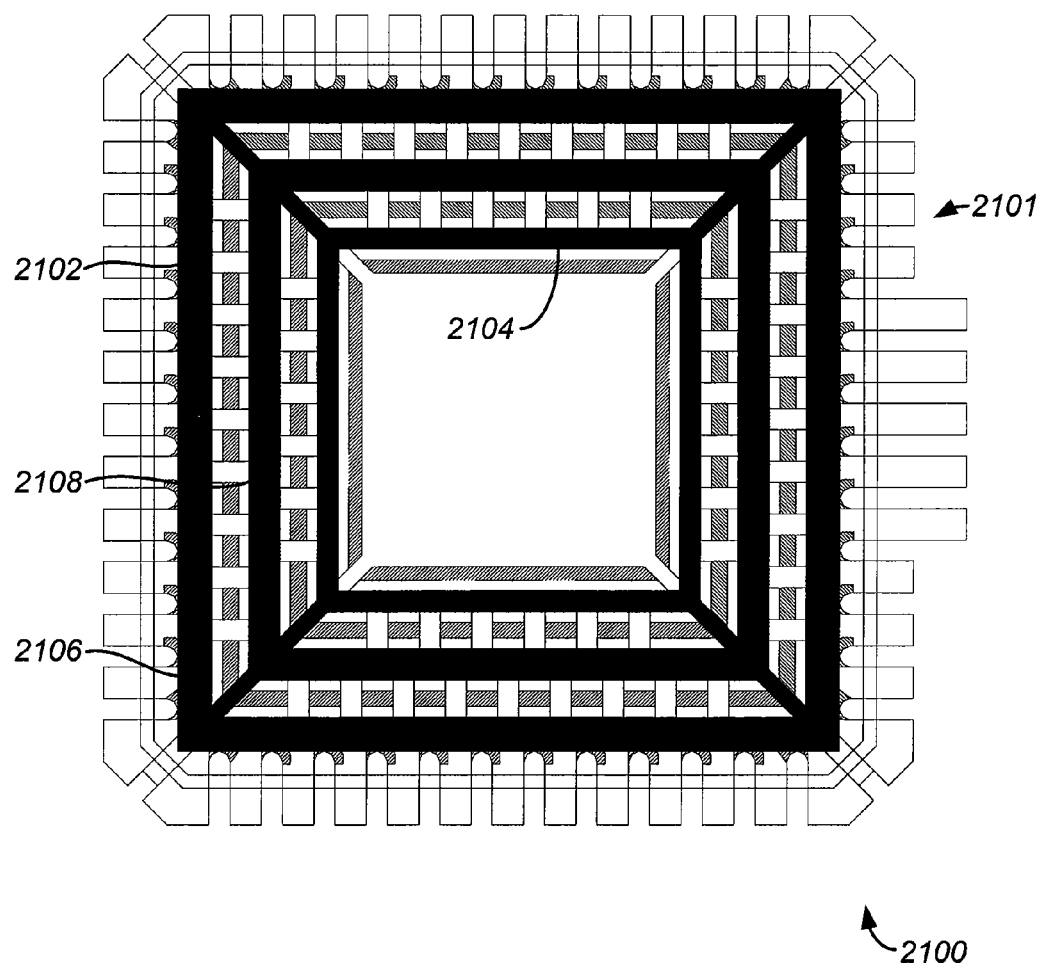
FIG. 21 is an illustration of a leadframe and attached ring member combination in which three rows of exposed leads are provided.
Figure 22:
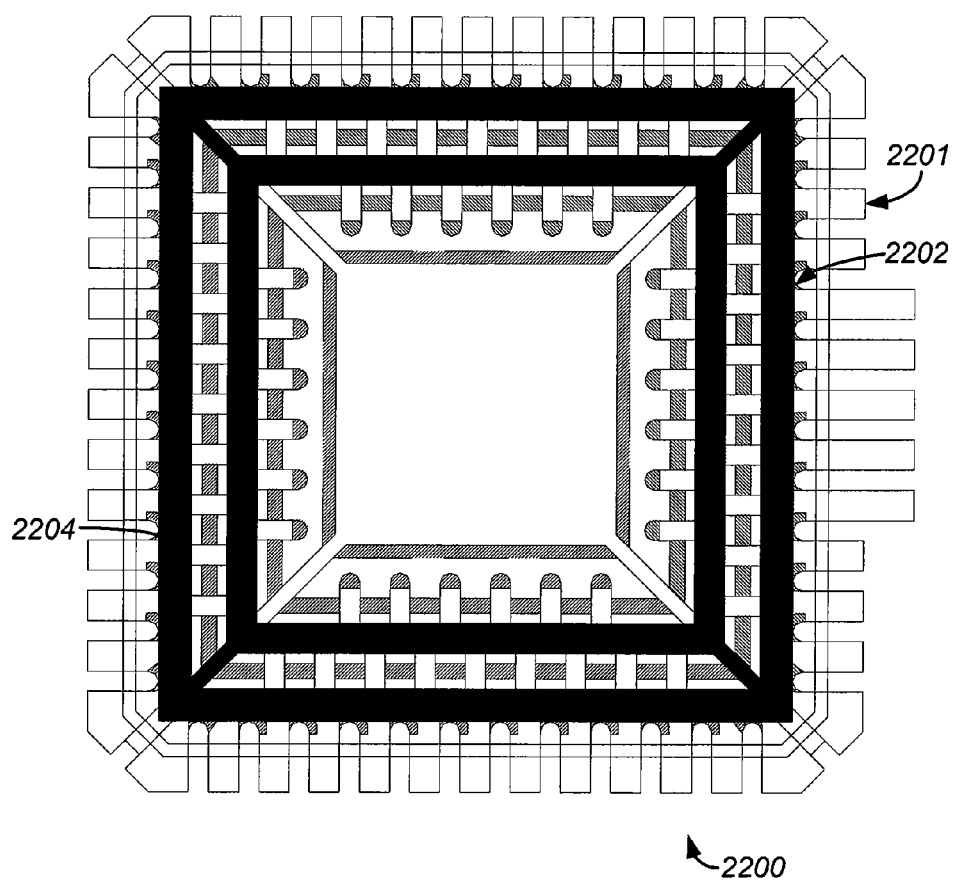
FIG. 22 is an illustration of a leadframe and attached ring member combination in which three rows of exposed leads are provided.
Figure 23:
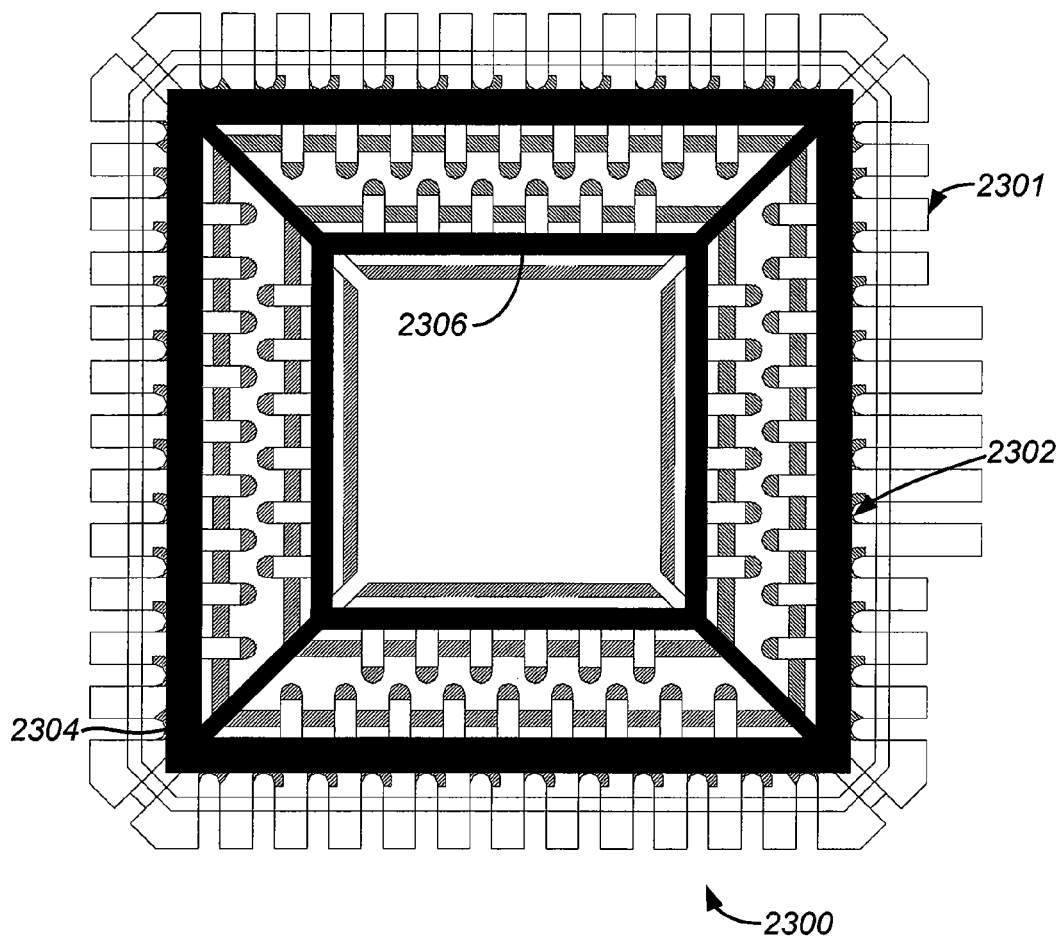
FIG. 23 is an illustration of a leadframe and attached ring member combination in which three rows of exposed leads are provided.

The three drawings FIG. 21, FIG. 22, and FIG. 23 show different embodiments of leadframe and ring frame combinations in which an MLP is created having three rows of exposed leads. The ring frames in these embodiments include multiple ring structures, generally in an annular or concentric arrangement of quadrilateral ring structures. The ring frames having multiple ring structures are to provide greater support to the connecting pads during production and after removal of the interconnecting pads, and thereby provide a more robust structure. The multiple-ring structures in FIGS. 21, 22, and 23 are configured for attachment to leadframes for three or more exposed lead rows of contact pads.

The FIG. 21 embodiment is an illustration of a combination 2100 comprising a leadframe 2101 and attached ring member 2102. The ring member 2102 includes three annular, generally quadrilateral ring structures, comprising an inner annular ring structure 2104, an outer annular ring structure 2106, and a middle annular ring structure 2108. The innermost row of leadframe connecting pads are connected to the inner ring structure 2104 of the ring member, the outermost and middle row of connecting pads are connected to the outer ring structure 2106, and the middle and innermost rows of connecting pads are connected to the middle ring structure 2108.

FIG. 22 is an illustration of a combination 2200 comprising a leadframe 2201 and an attached ring member 2202. The ring member 2202 includes two ring structures, an outer ring structure 2204 and an inner ring structure 2206. The outer ring structure 2204 is attached to the outermost and middle rows of leadframe connecting pads, and the inner ring structure 2206 is connected to the middle and innermost rows of leadframe connecting pads.

FIG. 23 is an illustration of a combination 2300 comprising a leadframe 2301 and an attached ring member 2302. The ring member 2302 includes two ring structures, an outer ring structure 2304 and an inner ring structure 2306. The outer ring structure 2304 is connected to the outermost and middle rows of leadframe connecting pads, and the inner ring structure 2306 is connected to the innermost row of leadframe connecting pads.

Figure 24:
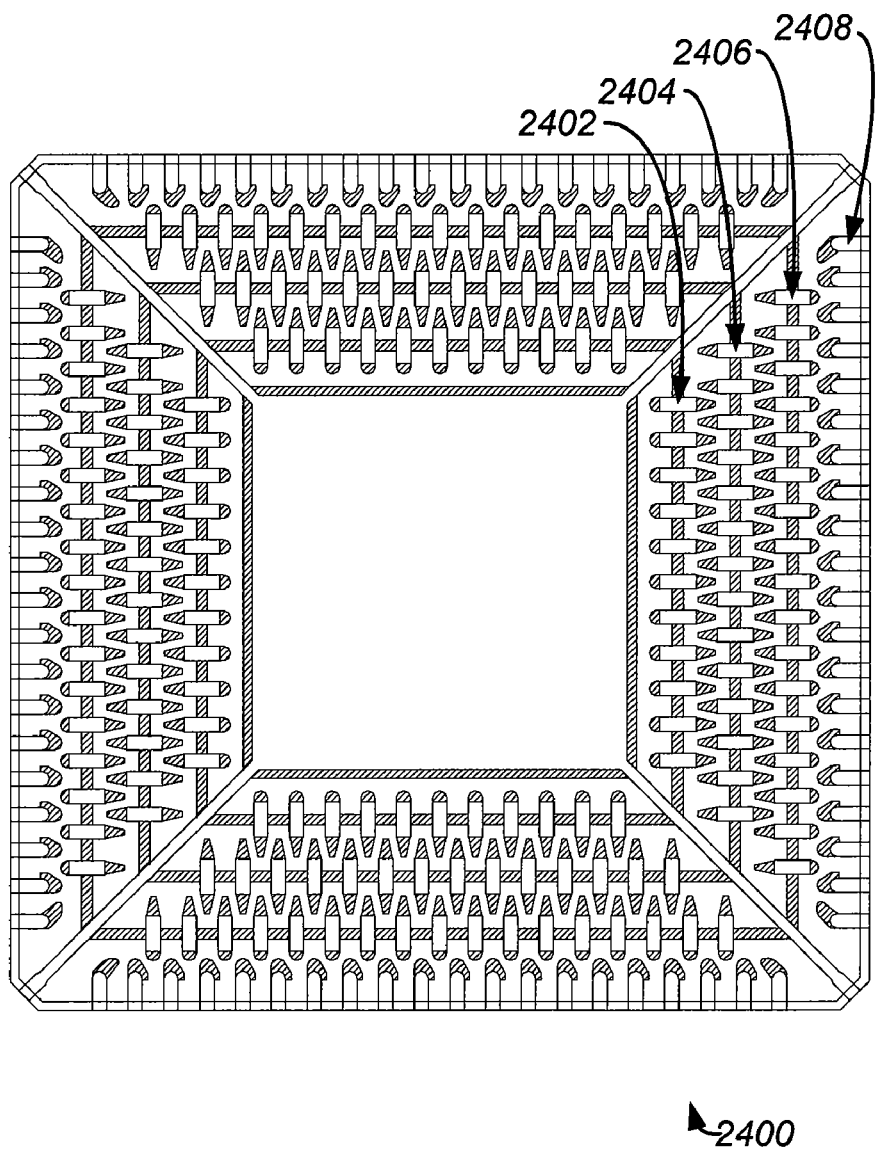
FIG. 24 is an illustration of a four-row leadframe member that can be used in conjunction with a ring member to provide a multiple-rows MLP.

FIG. 24 is an illustration of a four-row leadframe member 2400 that can be used in conjunction with a ring member to provide a multiple-rows MLP. The leadframe member 2400 includes an innermost row 2402 of contact pads, which will be referred to as Row 1, a next innermost row of contact pads 2404, referred to as Row 2, a next innermost row of contact pads 2406, referred to as Row 3, and an outermost row of contact pads, referred to as Row 4. That is, the rows of leadframe contact pads will be numbered outwardly, beginning with the innermost row and progressing outward.

Figure 25:
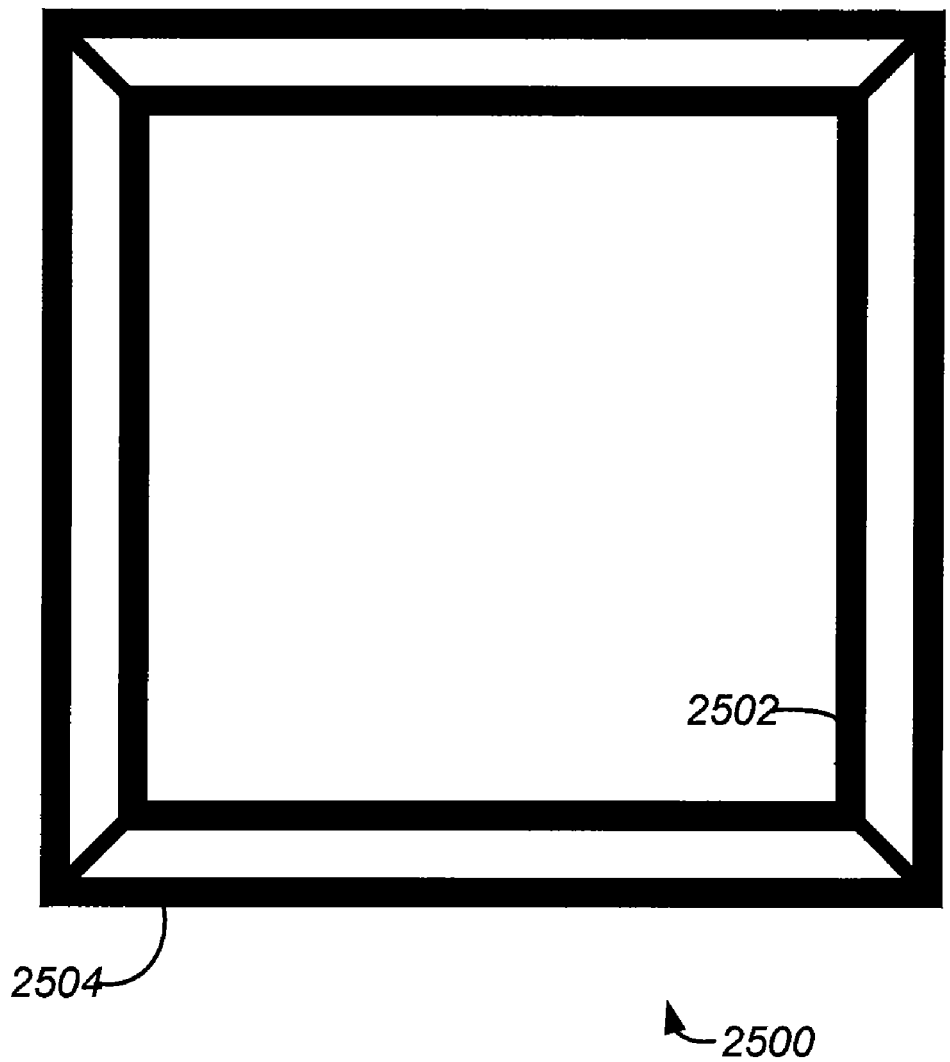
FIG. 25 is an illustration of a ring member that can be used in conjunction with a corresponding leadframe member to provide a multiple-rows MLP.

FIG. 25 is an illustration of a ring member 2500 that can be used in conjunction with a corresponding leadframe member to provide a multiple-rows MLP. The ring member 2500 includes an inner ring structure 2502 and an outer ring structure 2504.

Figure 26:
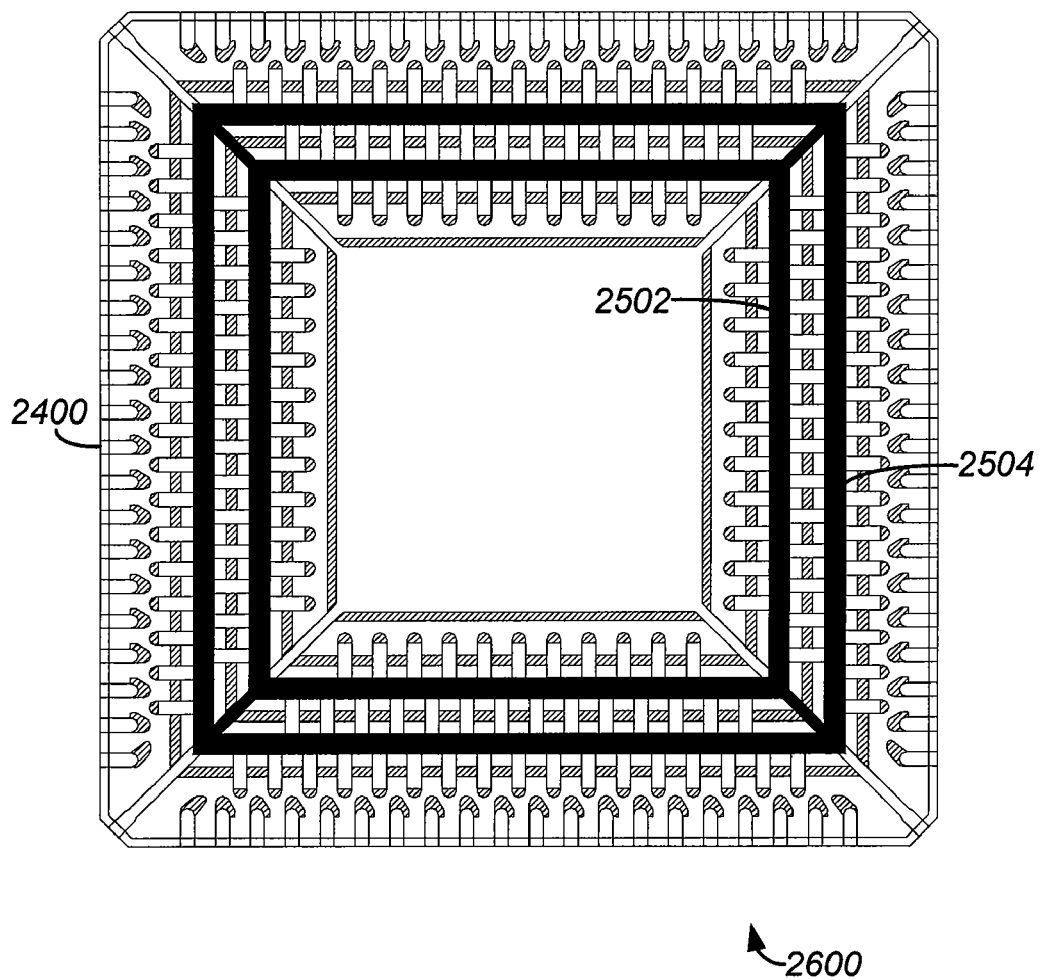
FIG. 26 is an illustration of the FIG. 24 leadframe and attached FIG. 25 ring member combination in which four rows of exposed leads are provided.

FIG. 26 is an illustration of a combination 2600 comprising the FIG. 24 leadframe 2400 and attached FIG. 25 ring member 2500 in which four rows of exposed leads are provided. The inner ring structure 2502 attaches to the Row 1 and Row 2 leadframe contact pads and the outer ring structure 2504 attaches to the Row 2 and Row 3 leadframe contact pads. After completion of packaging operations, the FIG. 26 combination will provide an MLP with four rows of exposed leads.

The description above has been given to help illustrate the principles of the invention. It is not intended to limit the scope of the invention in any way. A large variety of variants will be apparent to those skilled in the art, and are encompassed within the scope of this invention. While the invention has been described in detail and with reference to specific exemplary embodiments thereof, it will be apparent to one skilled in the art that various changes and modifications can be made therein without departing from the spirit and scope thereof. Such equivalents and alternatives are intended to be included within the scope of the present invention.

We claim:

1. A method of producing integrated circuit chip packages from a leadframe strip, the method comprising:
    coating a non-conductive adhesive material onto an attachment surface of a ring member;
    attaching the ring member to a multiple row leadframe member of the leadframe strip at the attachment surface such that the adhesive material bonds the multiple row leadframe member and ring member together, wherein the multiple row leadframe member includes connecting pads arranged in two or more rows along at least one side of the leadframe member and the connecting pads of two connecting pad rows are suspended by interconnects;
    removing the interconnects of the multiple row leadframe member;
    completing final operations to encapsulate integrated circuit chips bonded to the multiple row leadframe member.

2. The method as defined in claim 1, wherein the leadframe strip includes multiple leadframe members.

3. The method as defined in claim 1, wherein the ring member is a member of a ring frame strip that includes a plurality of ring members.

4. The method as defined in claim 3, further including cutting the ring member from the ring frame strip, wherein attaching the ring member further comprises attaching the cut ring member to the multiple row leadframe member.

5. The method as defined in claim 1, wherein the ring member is constructed of a conductive material.

6. The method as defined in claim 1, wherein the ring member is constructed of a non-conductive material.

7. The method as defined in claim 1, wherein the number of rows of connecting pads of the multiple row leadframe is three or more.

8. The method as defined in claim 1, wherein the interconnects are of reduced thickness relative to the connecting pads.

9. The method as defined in claim 1, wherein the ring member includes two or more annular ring structures.

10. The method as defined in claim 1, wherein the ring frame strip includes ring members that are configured to mate with corresponding leadframe members of the leadframe.

11. The method as defined in claim 1, wherein the non-conductive adhesive material is an epoxy material.

12. The method of claim 1, wherein each ring member of the ring frame strip includes one or more annular ring structures such that each annular ring structure is configured to mate with at least one corresponding row of connecting pads of the leadframe.

13. A method of producing integrated circuit chip packages from a leadframe strip, the method comprising:
    providing a leadframe strip having one or more multiple row leadframe members, each of which includes connecting pads arranged in two or more rows along at least one side of the leadframe member such that the connecting pads of two connecting pad rows are suspended by interconnects and the interconnects are of reduced thickness relative to the connecting pads;
    providing a ring frame strip having at least one ring member;
    coating a non-conductive adhesive material onto an attachment surface of the ring frame strip;
    cutting the at least one ring member from the ring frame strip;
    attaching the cut at least one ring member to a single one of the multiple row leadframe members at the attachment surface such that the adhesive material bonds the multiple row leadframe member and ring member together;
    removing the interconnects of the multiple row leadframe member;
    completing final operations to encapsulate one or more integrated circuit chips bonded to the multiple row leadframe.

14. The method as defined in claim 13, wherein the ring member is constructed of a conductive material.

15. The method as defined in claim 13, wherein the ring member is constructed of a non-conductive material.

16. The method as defined in claim 13, wherein the number of rows of connecting pads of the multiple row leadframe is three or more.

17. The method as defined in claim 13, wherein the ring member includes two or more annular ring structures.

18. The method as defined in claim 13, wherein the ring frame strip includes ring members that are configured to mate with corresponding leadframe members of the leadframe.

19. The method as defined in claim 13, wherein the non-conductive adhesive material is an epoxy material.

* * * * *